United States Patent
Miller et al.

(10) Patent No.: US 10,775,638 B2
(45) Date of Patent: Sep. 15, 2020

(54) BALL-BEARING RETAINERS

(71) Applicant: Hutchinson Technology Incorporated, Hutchinson, MN (US)

(72) Inventors: Mark A. Miller, Hutchinson, MN (US); Richard R. Jenneke, Hutchinson, MN (US); Raymond R. Wolter, Litchfield, MN (US); Donald M. Anderson, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 456 days.

(21) Appl. No.: 14/956,612

(22) Filed: Dec. 2, 2015

(65) Prior Publication Data

US 2016/0154252 A1    Jun. 2, 2016

Related U.S. Application Data

(60) Provisional application No. 62/086,595, filed on Dec. 2, 2014, provisional application No. 62/129,562, filed on Mar. 6, 2015.

(51) Int. Cl.
    *G02B 27/64*    (2006.01)
    *G02B 7/08*    (2006.01)
    (Continued)

(52) U.S. Cl.
    CPC ............ *G02B 27/646* (2013.01); *F16F 1/027* (2013.01); *F16F 15/005* (2013.01);
    (Continued)

(58) Field of Classification Search
    CPC .... G02B 27/64; G02B 27/646; G02B 27/648; G02B 7/023; G02B 7/09; G02B 13/001;
    (Continued)

(56) References Cited

U.S. PATENT DOCUMENTS

| 3,587,432 A | 6/1971 | Koch |
| 3,734,386 A | 5/1973 | Hazel |

(Continued)

FOREIGN PATENT DOCUMENTS

| CN | 1764239 A | 4/2006 |
| CN | 101246248 A | 8/2008 |

(Continued)

OTHER PUBLICATIONS

International Search Report and Written Opinion issued in PCT/US2015/062576, dated Mar. 2, 2016, 16 pages.
(Continued)

*Primary Examiner* — William R Alexander
*Assistant Examiner* — Alberto J Betancourt
(74) *Attorney, Agent, or Firm* — DLA Piper LLP (US)

(57) ABSTRACT

A camera lens suspension assembly includes a support member including a support metal base layer formed from a first unitary metal component, comprising a bearing plate portion in the support metal base layer. The assembly also includes a moving member including a moving metal base layer formed from a second unitary metal component and mounted to the support member, comprising a moving plate portion in the moving metal base layer, and flexure arms in the moving metal base layer extending from the moving plate portion and coupled to the support member. The assembly further includes a plurality of bearing-retaining recess between the bearing plate portion of the support member and the moving plate portion of the moving member, and ball-bearings within the bearing-retaining recesses, and between and engaging the bearing plate portion and the moving plate, to enable movement of the moving member with respect to the support member.

28 Claims, 16 Drawing Sheets

(51) Int. Cl.
| | |
|---|---|
| *G02B 7/02* | (2006.01) |
| *G02B 7/09* | (2006.01) |
| *F16F 1/02* | (2006.01) |
| *F16F 15/00* | (2006.01) |
| *F16M 13/02* | (2006.01) |
| *H05K 7/14* | (2006.01) |
| *H05K 1/02* | (2006.01) |

(52) U.S. Cl.
CPC .............. *F16M 13/022* (2013.01); *G02B 7/02* (2013.01); *G02B 7/023* (2013.01); *G02B 7/08* (2013.01); *G02B 7/09* (2013.01); *H05K 7/1417* (2013.01); *H05K 7/1422* (2013.01); *H05K 1/028* (2013.01)

(58) Field of Classification Search
CPC .............. G02B 7/026; H04N 5/23287; H04N 5/23248; H04N 5/23258; G03B 5/00; G03B 2205/0076; G03B 2205/00
USPC ........ 359/554–557, 819; 348/208.11, 208.99, 348/208.4; 396/55
See application file for complete search history.

(56) References Cited

U.S. PATENT DOCUMENTS

| | | | |
|---|---|---|---|
| 3,776,447 | A | 12/1973 | Simmons et al. |
| 4,140,265 | A | 2/1979 | Morino |
| 4,437,603 | A | 3/1984 | Kobayashi et al. |
| 4,781,319 | A | 11/1988 | Deubzer et al. |
| 4,984,581 | A | 1/1991 | Stice |
| 5,477,463 | A | 12/1995 | Tamura |
| 5,513,917 | A * | 5/1996 | Ide .................... F16C 17/06 384/100 |
| 5,831,820 | A | 11/1998 | Huang |
| 5,840,417 | A | 11/1998 | Bolger |
| 6,149,742 | A | 11/2000 | Carpenter et al. |
| 6,279,215 | B1 | 8/2001 | Nomoto |
| 6,916,115 | B1 | 7/2005 | Vallance et al. |
| 7,384,531 | B1 | 6/2008 | Peltoma et al. |
| 7,388,733 | B2 | 6/2008 | Swanson et al. |
| 7,679,647 | B2 | 3/2010 | Stavely et al. |
| 7,929,252 | B1 | 4/2011 | Hentges et al. |
| 8,144,430 | B2 | 3/2012 | Hentges et al. |
| 8,169,746 | B1 | 5/2012 | Rice et al. |
| 8,218,958 | B2 | 7/2012 | Sato |
| 8,350,959 | B2 | 1/2013 | Topliss et al. |
| 8,388,773 | B2 | 3/2013 | Luntz et al. |
| 8,421,908 | B2 | 4/2013 | Kosaka et al. |
| 8,570,384 | B2 | 10/2013 | Brown |
| 8,602,665 | B2 | 12/2013 | Kamatani et al. |
| 8,848,064 | B2 | 9/2014 | Topliss et al. |
| 8,885,299 | B1 | 11/2014 | Bennin et al. |
| 9,175,671 | B2 | 11/2015 | Howarth |
| 9,366,879 | B1 | 6/2016 | Miller |
| 9,454,016 | B1 | 9/2016 | Ladwig et al. |
| 9,479,699 | B2 | 10/2016 | Brown et al. |
| 9,541,769 | B2 | 1/2017 | Ladwig et al. |
| 10,036,897 | B2 | 7/2018 | Ladwig et al. |
| 10,067,357 | B2 | 9/2018 | Ladwig et al. |
| 10,139,647 | B2 | 11/2018 | Miller |
| 2004/0036479 | A1 | 2/2004 | Thomsen |
| 2004/0093610 | A1 | 5/2004 | Suzuki et al. |
| 2005/0115235 | A1 | 6/2005 | Mernoe |
| 2008/0183257 | A1 | 7/2008 | Imran et al. |
| 2008/0231955 | A1 | 9/2008 | Otsuka |
| 2009/0295986 | A1 | 12/2009 | Topliss et al. |
| 2010/0074607 | A1 | 3/2010 | Topliss et al. |
| 2010/0074608 | A1 | 3/2010 | Topliss |
| 2010/0119863 | A1 | 5/2010 | Bogursky et al. |
| 2011/0249131 | A1 | 10/2011 | Topliss et al. |
| 2012/0151913 | A1 | 6/2012 | Foshansky |
| 2012/0154614 | A1 | 6/2012 | Moriya et al. |
| 2012/0174574 | A1 | 7/2012 | Kotanagi et al. |
| 2013/0016427 | A1 | 1/2013 | Sugawara |
| 2013/0169092 | A1 * | 7/2013 | Neuhaus ................ F16C 35/06 384/91 |
| 2013/0221071 | A1 | 8/2013 | Kim et al. |
| 2013/0222685 | A1 | 8/2013 | Topliss et al. |
| 2013/0292856 | A1 | 11/2013 | Braun et al. |
| 2013/0300880 | A1 | 11/2013 | Brown et al. |
| 2013/0338730 | A1 | 12/2013 | Shiroff et al. |
| 2014/0055630 | A1 | 2/2014 | Gregory et al. |
| 2015/0068013 | A1 | 3/2015 | Galu, Jr. |
| 2015/0135703 | A1 | 5/2015 | Eddington et al. |
| 2015/0304561 | A1 * | 10/2015 | Howarth ............ G02B 27/646 348/374 |
| 2015/0346507 | A1 | 12/2015 | Howarth |
| 2015/0365568 | A1 | 12/2015 | Topliss et al. |
| 2016/0154250 | A1 | 6/2016 | Miller |
| 2016/0154251 | A1 | 6/2016 | Ladwig et al. |
| 2016/0154252 | A1 * | 6/2016 | Miller .................... G02B 7/09 359/557 |
| 2016/0227088 | A1 | 8/2016 | Brown et al. |
| 2016/0258425 | A1 | 9/2016 | Ladwig et al. |
| 2016/0259177 | A1 | 9/2016 | Ladwig et al. |
| 2016/0259178 | A1 | 9/2016 | Miller |
| 2016/0263889 | A1 | 9/2016 | Hamaguchi et al. |
| 2016/0294141 | A1 | 10/2016 | Davis et al. |
| 2017/0131562 | A1 | 5/2017 | Ladwig et al. |
| 2017/0160559 | A1 | 6/2017 | Ladwig et al. |
| 2017/0219842 | A1 | 8/2017 | Howarth et al. |
| 2017/0336646 | A1 | 11/2017 | Miller et al. |
| 2017/0357076 | A1 | 12/2017 | Scheele et al. |
| 2018/0373056 | A1 | 12/2018 | Ladwig et al. |
| 2019/0162982 | A1 | 5/2019 | Miller |

FOREIGN PATENT DOCUMENTS

| | | |
|---|---|---|
| CN | 101300831 A | 11/2008 |
| CN | 101668947 A | 3/2010 |
| CN | 101876742 A | 11/2010 |
| CN | 102089695 A | 6/2011 |
| CN | 102150073 A | 8/2011 |
| EP | 1870962 A2 | 12/2007 |
| EP | 2140138 A2 | 1/2010 |
| EP | 2 732 331 A1 | 5/2014 |
| EP | 2920955 A1 | 9/2015 |
| JP | 2006-031026 A | 2/2006 |
| JP | 2007-092556 A | 4/2007 |
| JP | 2008-233526 A | 10/2008 |
| JP | 2009-103861 A | 5/2009 |
| JP | 2009-531729 A | 9/2009 |
| JP | 2011-022250 A | 2/2011 |
| JP | 2011-065140 A | 3/2011 |
| JP | 2011-107413 A | 6/2011 |
| JP | 2012-502323 A | 1/2012 |
| JP | 2012-517611 A | 8/2012 |
| JP | 2015-518977 A | 7/2015 |
| KR | 10-2009-0081855 A | 7/2009 |
| KR | 10-2015-0013017 A | 2/2015 |
| WO | 2010/089526 A2 | 8/2010 |
| WO | 2013153400 A2 | 10/2013 |
| WO | 2013175197 A1 | 11/2013 |
| WO | 2014076463 A1 | 5/2014 |
| WO | 2014083318 A1 | 6/2014 |
| WO | 2015132571 A1 | 9/2015 |
| WO | 2016009200 A1 | 1/2016 |

OTHER PUBLICATIONS

International Search Report and Written Opinion issued in PCT/US2015/062713, dated Mar. 2, 2016, 16 pages.
International Search Report and Written Opinion issued in PCT/US2015/063363, dated Feb. 12, 2016, 15 pages.
International Search Report and Written Opinion issued in PCT/US16/54274, dated Dec. 13, 2016, 14 pages.
International Search Report and Written Opinion issued in PCT/US2016/021230, dated Jun. 3, 2016, 23 pages.
International Search Report and Written Opinion issued in PCT/US2016/025194, dated Jun. 30, 2016, 23 pages.

(56) References Cited

OTHER PUBLICATIONS

International Preliminary Report on Patentability in International Application No. PCT/US2015/062576, dated Jun. 15, 2017.
International Preliminary Report on Patentability in International Application No. PCT/US2015/062713, dated Jun. 15, 2017.
International Preliminary Report on Patentability in International Application No. PCT/US2015/063363, dated Jun. 15, 2017.
International Preliminary Report on Patentability in International Application No. PCT/US2016/021230, dated Sep. 21, 2017.
International Search Report and Written Opinion in International Application No. PCT/US2015/066939, dated Mar. 14, 2016.
Office Action in U.S. Appl. No. 15/063,151, dated Feb. 21, 2018.
Office Action in U.S. Appl. No. 15/156,545, dated May 8, 2017.
Office Action in U.S. Appl. No. 15/156,545, dated Dec. 26, 2017.
Office Action in U.S. Appl. No. 15/276,115, dated Sep. 18, 2017.
Office Action in U.S. Appl. No. 15/400,516, dated Sep. 21, 2017.
Office Action in U.S. Appl. No. 15/400,516, dated Dec. 15, 2017.
Extended European Search Report in European Application No. 15866032.4, dated Mar. 22, 2018.
Extended European Search Report in European Application No. 15864743.8, dated Mar. 22, 2018.
Extended European Search Report in European Application No. 15865383.2, dated Mar. 22, 2018.
International Search Report and Written Opinion in International Application No. PCT/US2017/033517, dated Aug. 4, 2017.
International Search Report and Written Opinion in International Application No. PCT/US2017/036884, dated Oct. 19, 2017.
Notice of Allowance in U.S. Appl. No. 15/276,115, dated Mar. 26, 2018.
Notice of Allowance in U.S. Appl. No. 15/400,516, dated May 4, 2018.
Office Action in U.S. Appl. No. 15/599,449, dated Jan. 25, 2018.
Extended European Search Report in European Application No. 16762309.9, dated Aug. 1, 2018.
Office Action in Chinese Application No. 201680025323.3, dated Dec. 28, 2018.
International Preliminary Report on Patentability in International Application No. PCT/US2017/033517, dated Nov. 29, 2018.
International Preliminary Report on Patentability in International Application No. PCT/US2017/036884, dated Dec. 20, 2018.
Office Action in U.S. Appl. No. 15/063,151, dated Jul. 26, 2018.
Notice of Allowance in U.S. Appl. No. 15/156,545, dated Jul. 26, 2018.
Corrected Notice of Allowance in U.S. Appl. No. 15/276,115, dated Jul. 3, 2018.
Office Action in U.S. Appl. No. 15/599,449, dated Oct. 31, 2018.
Office Action in U.S. Appl. No. 15/618,917, dated Jan. 11, 2019.
Office Action in Chinese Application No. 201580065890.7, dated Mar. 27, 2019.
Second Office Action in Chinese Application No. 201580065890.7, dated Sep. 29, 2019.
Notice of Reasons for Refusal in Japanese Patent Application No. 2017-529018 dated Jan. 7, 2020.
Office Action in Chinese Application No. 201580065775.X, dated Mar. 27, 2019.
Second Office Action in Chinese Patent Application No. 201580065775.X, dated Dec. 25, 2019.
Notice of Reasons for Refusal in Japanese Patent Application No. 2017-529039 dated Dec. 3, 2019.
Extended European Search Report in European Application No. 19193083.3, dated Oct. 29, 2019.
Office Action in Chinese Application No. 201580065332.0, dated Mar. 18, 2019.
Second Office Action in Chinese Patent Application No. 201580065332.0, dated Dec. 16, 2019.
Notice of Reasons for Refusal in Japanese Patent Application No. 2017-529044 dated Jan. 7, 2020.
Examination Report in European Application No. 16762309.9, dated Apr. 4, 2019.
Second Office Action in Chinese Patent Application No. 201680025323.3, dated Sep. 30, 2019.
Extended European Search Report in European Application No. 19173490.4, dated Jul. 12, 2019.
Extended European Search Report in European Patent Application No. 17800231.7, dated Dec. 9, 2019.
Office Action in U.S. Appl. No. 15/063,151, dated May 29, 2019.
Office Action in U.S. Appl. No. 15/063,151, dated Nov. 27, 2019.
Office Action in U.S. Appl. No. 16/200,570, dated Dec. 9, 2019.
Office Action in U.S. Appl. No. 15/599,449, dated Apr. 17, 2019.
Notice of Allowance in U.S. Appl. No. 15/599,449, dated Jan. 27, 2020.
Office Action in U.S. Appl. No. 15/618,917, date Aug. 9, 2019.
Notice of Allowance in U.S. Appl. No. 15/618,917, dated Jan. 17, 2020.
Chinese Patent Application No. 20158006589007, dated Sep. 29, 2019.
European Patent Application No. 19193083, Supplementary European Search Report, Oct. 10, 2019.
Chinese Patent Application No. 201680025323.3, dated Sep. 30, 2019.
European Patent Application No. 19173490.4, Written Opinion, Oct. 28, 2019.
European Patent Application No. 19193083.3. Written Opinion, Oct. 29, 2019.
Third Office Action in Chinese Patent Application No. 201580065890.7 dated Feb. 18, 2020.
Decision to Grant for Japanese Patent Application No. 2017-529039 dated Mar. 17, 2020.
Notice of Reasons for Refusal for Japanese Patent Application No. 2017-546796 dated Mar. 31, 2020.
Extended European Search Report in European Patent Application No. 17811132.4, dated Jan. 23, 2020.
Restriction Requirement in U.S. Appl. No. 16/119,619, dated May 5, 2020.

* cited by examiner

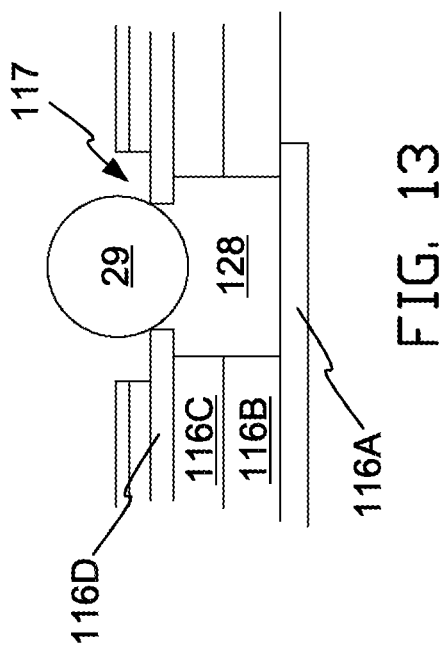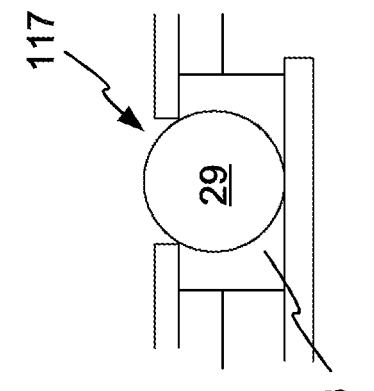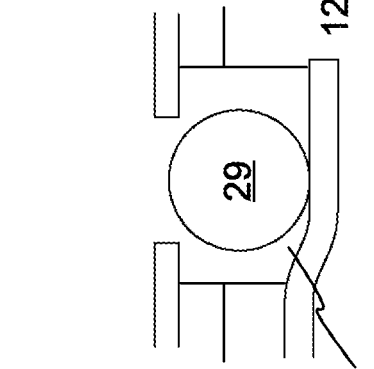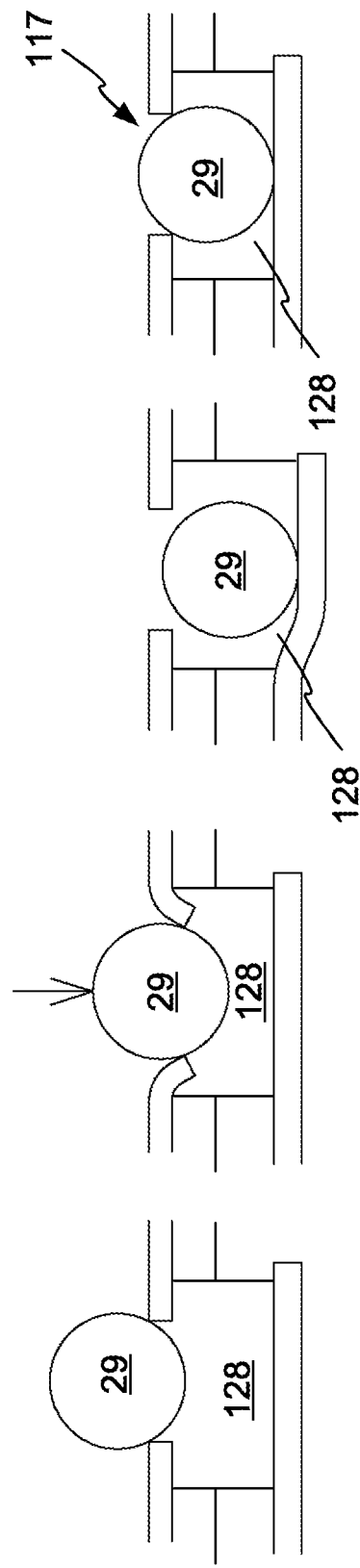

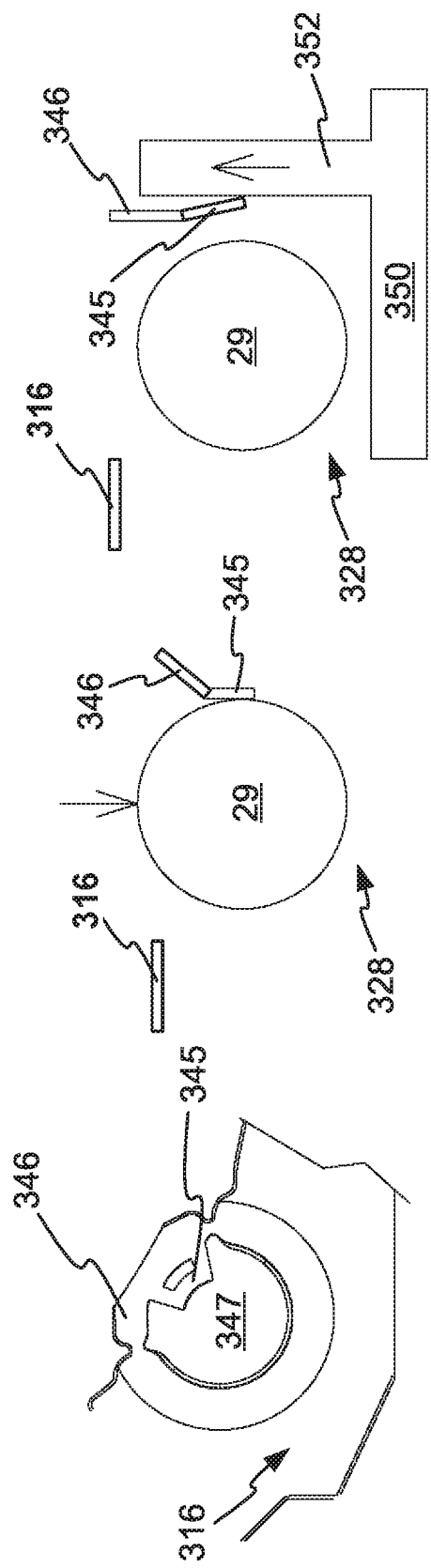

BALL-BEARING RETAINERS

CROSS REFERENCE TO RELATED APPLICATIONS

This application claims the benefit of the following U.S. Provisional Applications, both which are incorporated herein by reference in their entirety and for all purposes: No. 62/086,595, filed on Dec. 2, 2014, entitled Improvements to Optical Image Stabilization (OIS) Camera Lens Suspension, and No. 62/129,562, filed on Mar. 6, 2015, entitled Two-Piece Camera Lens Suspension with Integrated Electrical Leads.

FIELD OF THE INVENTION

The invention relates generally to camera lens suspensions such as those incorporated into mobile phones.

BACKGROUND

PCT International Application Publication Nos. WO 2014/083318 and WO 2013/175197 disclose a camera lens optical image stabilization (OIS) suspension system that has a moving assembly (to which a camera lens element can be mounted) supported by a flexure element or spring plate on a stationary support assembly. The moving assembly is supported for movement on the support assembly by plural balls. The flexure element, which is formed from metal such as phosphor bronze, has a moving plate and flexures. The flexures extend between the moving plate and the stationary support assembly and function as springs to enable the movement of the moving assembly with respect to the stationary support assembly. The balls allow the moving assembly to move with little resistance. The moving assembly and support assembly are coupled by shape memory alloy (SMA) wires extending between the assemblies. Each of the SMA wires has one end attached to the support assembly, and an opposite end attached to the moving assembly. The suspension is actuated by applying electrical drive signals to the SMA wires. The above-identified PCT publications are incorporated herein by reference for all purposes.

There remains a continuing need for improved lens suspensions. Suspension structures of these types that are highly functional, relatively thin or low profile, robust and efficient to manufacture would be particularly desirable.

SUMMARY

The invention is an improved suspension assembly comprising a support member including a support metal base layer formed from a first unitary metal component, i.e., from a single piece of metal, the support metal base layer comprising a bearing plate portion in the support metal base layer. The suspension assembly also includes a moving member including a moving metal base layer formed from a second unitary metal component and mounted to the support member, comprising a moving plate portion in the moving metal base layer, and flexure arms in the moving metal base layer extending from the moving plate portion and coupled to the support member. The suspension assembly further includes a plurality of bearing-retaining recess between the bearing plate portion of the support member and the moving plate portion of the moving member, and a plurality of ball-bearings within the bearing-retaining recesses, and between and engaging the bearing plate portion of the support member and the moving plate portion of the moving member, to enable movement of the moving member with respect to the support member.

BRIEF DESCRIPTION OF THE DRAWINGS

FIGS. 13-14D are conceptual illustrations representing embodiments in which a bearing-retaining recess includes an aperture smaller than the diameter of the ball-bearing within one or more layers of one of the support member and the moving member.
FIGS. 16A-18C are conceptual illustrations representing embodiments in which a bearing-retaining recess includes a flexible or deformable retainer formed within one or more layers of one of the support member and the moving member.

DESCRIPTION OF THE INVENTION

Figure 1A:
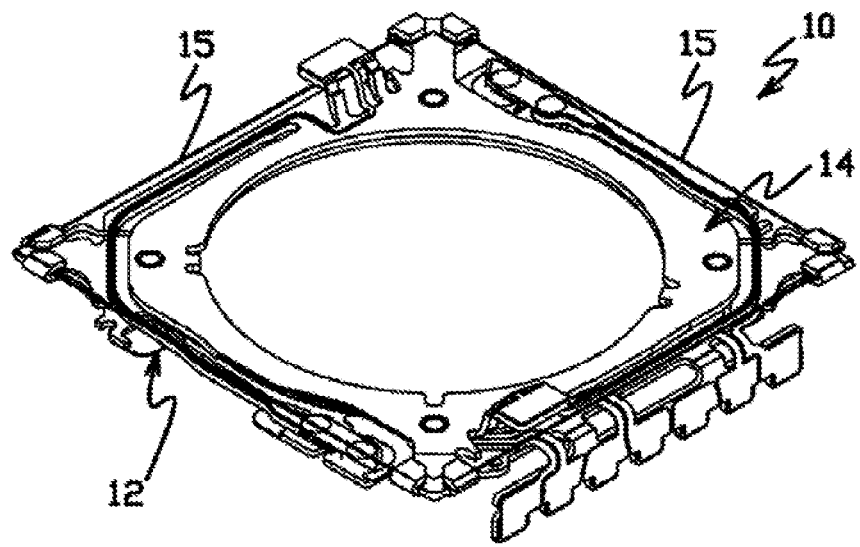
FIG. 1A is a top isometric view of a suspension in accordance with embodiments of the invention.
Figure 1B:
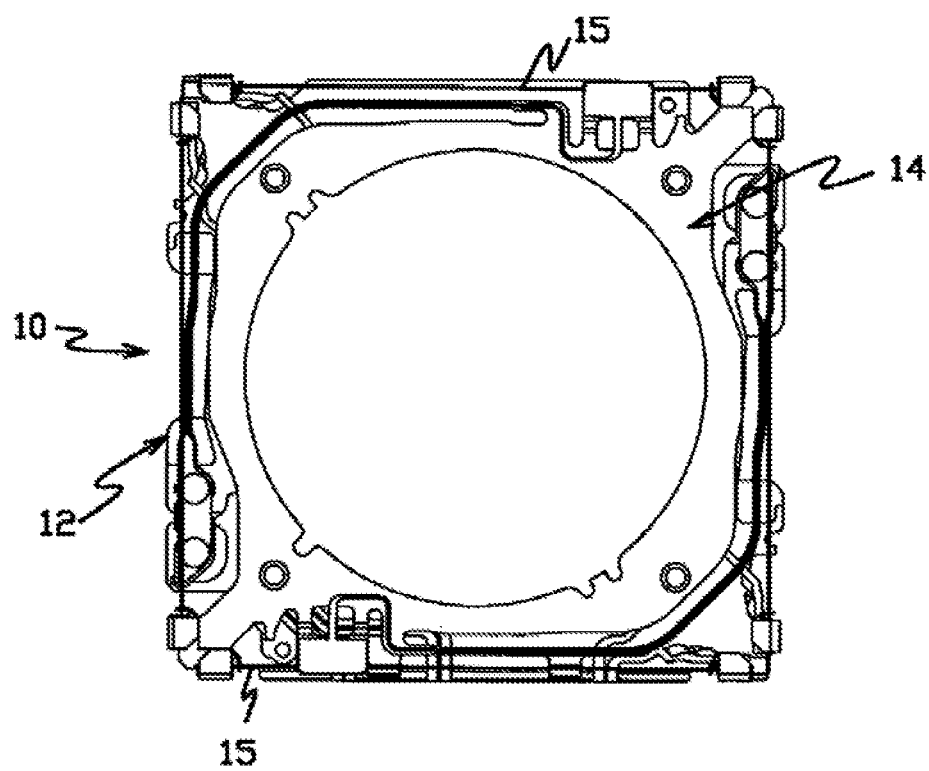
FIG. 1B is a top plan view of the suspension shown in FIG. 1A.

FIGS. 1A and 1B illustrate a suspension assembly 10 in accordance with embodiments of the invention. As shown, the suspension assembly 10 includes a flexible printed circuit (FPC) or support member 12 and a spring crimp circuit or moving member 14 that is coupled to the support member. Shape memory alloy (SMA) wires 15 extend between the support member 12 and the moving member 14, and can be electrically actuated to move and control the position of the moving member with respect to the support member. In embodiments, the suspension assembly 10 is a camera lens optical image stabilization (OIS) device that can be incorporated, for example, into mobile phones, tablets, laptop computers.

The suspension assembly has two primary components—a base or support member (also referred to as a static FPC), and a moving/spring member (also referred to as a spring crimp circuit). Both the static FPC (base member) and the spring crimp circuit (moving member) are integrated lead structures in the illustrated embodiments, in that they have electrical structures such as leads, contact pads and terminals (e.g. in a copper "Cu" or copper alloy layer) formed on the base metal (stainless steel (SST)) in the illustrated embodiments). A layer of insulator (e.g., polyimide or "poly") separates the portions of the electrical structures that are to be electrically isolated from the SST (other portions of the Cu layer are connected to or directly on the SST layer). At some locations, the electrical structures can be electrically connected to the SST layer by electrical connections (e.g., "vias") extending from the Cu trace or lead layer to the SST layer through openings in the poly layer. In embodiments, a lens can be mounted to the spring crimp circuit. In yet other embodiments, an autofocus system supporting the lens can be mounted to the spring crimp circuit.

As noted above, the static FPC and spring crimp circuit can be formed from overlaying layers of base metal (e.g., a spring metal such as SST), poly and Cu (i.e., the "trace" layer). An insulating covercoat can be applied over all or portions of the Cu. Corrosion resistant metals such as gold (Au) and/or nickel (Ni) can be plated or otherwise applied to portions of the trace layer to provide corrosion resistance. Conventional additive deposition and/or subtractive processes such as wet (e.g., chemical) and dry (e.g., plasma) etching, electro plating and electroless plating and sputtering processes in connection with photolithography (e.g., use of patterned and/or unpatterned photoresist masks), as well as mechanical forming methods (e.g., using punches and forms) can be used to manufacture the static FPC and spring crimp circuit in accordance with embodiments of the invention. Additive and subtractive processes of these types are, for example, known and used in connection with the manufacture of disk drive head suspensions, and are disclosed generally in the following U.S. patents, all of which are incorporated herein by reference for all purposes: Bennin et al. U.S. Pat. No. 8,885,299 entitled Low Resistance Ground Joints for Dual Stage Actuation Disk Drive Suspensions, Rice et al. U.S. Pat. No. 8,169,746 entitled Integrated Lead Suspension with Multiple Trace Configurations, Hentges et al. U.S. Pat. No. 8,144,430 entitled Multi-Layer Ground Plane Structures for Integrated Lead Suspensions, Hentges et al. U.S. Pat. No. 7,929,252 entitled Multi-Layer Ground Plane Structures for Integrated Lead Suspensions, Swanson et al. U.S. Pat. No. 7,388,733 entitled Method for Making Noble Metal Conductive Leads for Suspension Assemblies, Peltoma et al. U.S. Pat. No. 7,384,531 entitled Plated Ground Features for Integrated Lead Suspensions.

The static FPC is a one-piece member in the illustrated embodiment, and has two static crimps (attachment structures) on each of two diagonal corners of the member (4 static crimps in total). A terminal pad section includes terminal pads in the trace layer that are connected to traces that extend over the surface of the member. As shown for example, a separate trace extends to each of the four static crimps. At each of the static crimps is an electrical contact or terminal formed by the trace and poly layers. Formed dimples extending from the upper surface of the static FPC member engage the back surface of the spring crimp circuit member, and function as sliding interface bearings to enable low friction movement of the spring crimp circuit member with respect to the static FPC. The traces on the static FPC also couple terminal pads to electrical pad locations on the static FPC that are electrically and mechanically coupled to the spring crimp circuit member (e.g., to provide electrical signals to an auto focus (AF) assembly and to provide a common or ground signal path to the SST layer of the spring crimp circuit member). Vias couple the respective traces on the static FPC to portions of the SST layer that are connected to the feet.

The spring crimp circuit is a one-piece member in the illustrated embodiments and includes a central member for supporting a lens or auto focus system, and one or more spring arms (two in the illustrated embodiment) extending from the central member. The spring crimp member has two moving crimps on each of two diagonal corners of the member (4 moving crimps in all). Pedestals or feet in the SST layer (on the ends of the spring arms opposite the central member in the illustrated embodiment) are configured to be welded or otherwise attached to corresponding locations on the static FPC. Traces on the spring crimp member are configured to be electrically coupled to traces on the static FPC (e.g., through the feet) and couple signals to terminal pads such as the auto focus (AF) terminal pads. In the illustrated embodiment, the SST layer of the spring crimp circuit is used as a signal path to the ends of the SMA wires attached to the moving crimps. Electrical connection between the corresponding terminal pad and trace on the static FPC to the SST layer of the spring crimp circuit is provided by the connection between the feet of the spring arms and the SST layer of the static FPC (i.e., the SST layers of the two members are electrically coupled, and are at a common ground potential in embodiments).

FIGS. 2A, 2B, 3A and 3B illustrate the support member 12 in greater detail. As shown, the support member 12 includes a base layer 16 and a plurality of conductive traces 18 such as traces 18a-18d in a conductor layer on the base layer. A layer of dielectric 20 is located between the conductive traces 18 and the base layer 16 to electrically insulate the traces from the base layer, which can be metal such as stainless steel. A plurality of wire attach structures such as crimps 24 (i.e., static crimps; four are shown in the illustrated embodiment) are located on the base layer 16. In the illustrated embodiment the crimps 24 are organized as two pairs of adjacent structures that are integrally formed on a ledge 25 in the base layer 16 at a level spaced (e.g., in a z-direction) from a major planar surface portion 26 of the base layer. Other embodiments (not shown) include other wire attach structures (e.g., solder pads) and/or wire attach structures that are organized in other arrangements (e.g., singly rather than in pairs). In embodiments, bearing-retaining recesses 28 are formed in the portion 26 of base layer 16. Bearings (shown in FIG. 8) in the recesses 28 can engage the moving member 14 and movably support the moving member with respect to the support member 12. Traces 18 include terminals 30 and contact pads 32 in the conductor layer on the base layer 16. Each of the traces 18 couples a terminal 30 to a contact pad 32. For example, contact pads 32a and 32b are at a first mount region 33 of the support member 12, and traces 18a and 18b couple terminals 30a and 30b to pads 32a and 32b, respectively. Contact pads 32 at a second mount region 35 are similarly coupled to terminal 30 by traces 18. A contact pad 32 is located at each of the crimps 24 in the illustrated embodiment, and each of the contact pads is coupled by a separate trace to a separate terminal 30 (e.g., trace 18d couples terminal 30d to pad 32d). The portion of the base layer 16 on which the terminals 30 are located is formed out of the plane of the major surface portion 26 (e.g., perpendicular to the plane of the major surface portion in the illustrated embodiment). In the illustrated embodiment, the crimps 24 are unitary with and formed from the same piece of material of the base layer 16 as the surface portion 26.

Figure 3A:
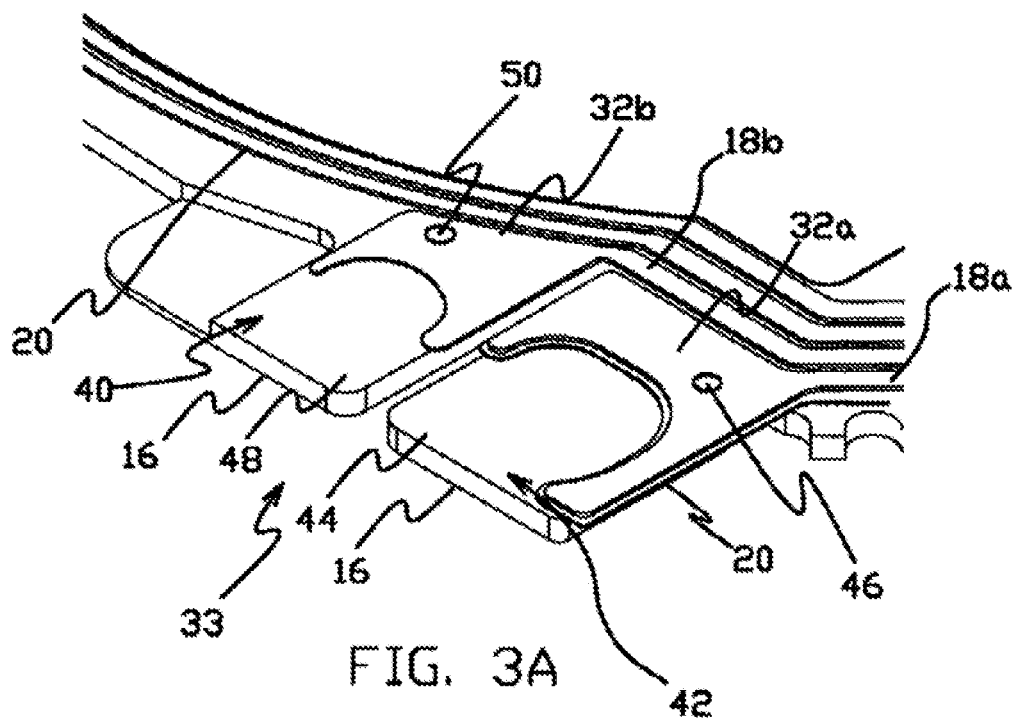
FIG. 3A is a detailed top isometric view of a mount region of the support member shown in FIG. 2A.
Figure 3B:
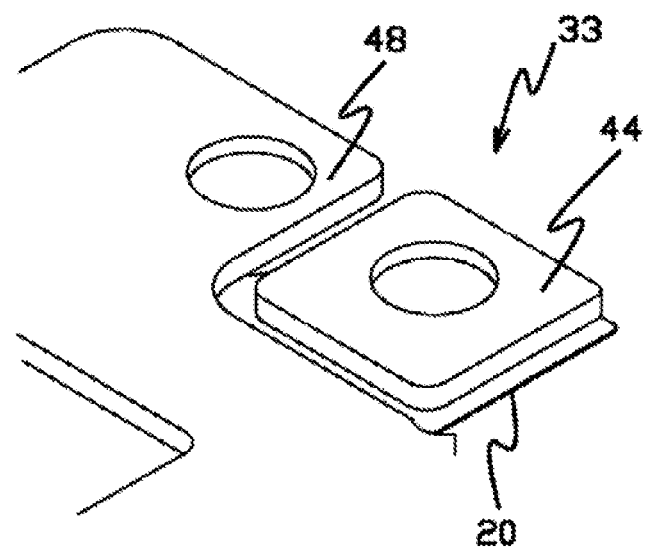
FIG. 3B is a detailed bottom isometric view of the mount region of the support member shown in FIG. 2A.

FIGS. 3A and 3B illustrate in greater detail embodiments of the mount region 33 of the support member 12. As shown, the mount region 33 includes first and second mounting pads 40 and 42. Mounting pad 42 includes an island or pad portion 44 in the base layer 16 that is electrically isolated from other portions of the base layer. The island pad portion 44 can be supported in part from adjacent portions of the base layer 16 by areas of dielectric 20 that extend between the island pad portion and adjacent portions of the base layer. Trace 18a and contact pad 32a extend to the island pad portion 44, and in embodiments are electrically connected to the island pad portion 44 by an electrical connection such as a plated or other via 46 that extends through the dielectric 20 at the mounting pad 42. Other embodiments include other electrical connections in place of or in addition to via 46, such as, for example, conductive adhesive that extends between the contact pad 32a and island pad portion 44 over the edges of the dielectric 20. Mounting pad 40 is adjacent to mounting pad 42, and includes a pad portion 48 in the base layer 16 (that in embodiments functions as an electrical ground or common structure), and an electrical connection such as via 50 that connects the contact pad 32b to the pad portion 48. The mount region 35 can be similar to mount region 33.

FIGS. 4A, 4B, 5, 6 and 7 illustrate embodiments of the moving member 14 in greater detail. As shown, the moving member 14 includes a plate 60 and spring or flexure arms 62 extending from the plate 60. In the illustrated embodiments, the plate 60 is a rectangular member, and each flexure arm 62 is an elongated member having first and second portions 64 and 66 that extend along two sides of the periphery of the plate. In the illustrated embodiment, the plate 60 and flexure arms 62 are formed in the same piece of material of a spring metal base layer 68 such as stainless steel. Moving member 14 also includes SMA wire attach structures such as crimps 70 (moving crimps; four are shown in the illustrated embodiment, organized in pairs). In the illustrated embodiment, the crimps 70 are unitary with and formed from the same piece of spring metal base layer 68 as the plate 60 (i.e., on ends of arms 72 extending from the plate). Moving member 14 is configured differently in other embodiments. For example, in other embodiments (not shown) the flexure arms 62 can be shaped differently, be different in number, organized differently, and/or can extend from other locations on the plate 60. In still other embodiments (not shown), the crimps 70 can be formed as separate structures that are attached to the plate 60 (i.e., not unitary with the plate). Other embodiments (not shown) include other types of wire attach structures (e.g., solder pads) and/or wire attach structures that are organized in other arrangements (e.g., singly rather than in pairs).

The end portions of the flexure arms 62 have mount regions 74 that are configured to be mounted to the mount regions 33 and 35 of the support member 12. Conductive traces 76 on the base layer 68 extend on the flexure arms 62 from the mount regions 74. In embodiments, the traces 76 also extend on the base layer 68 over portions of the plate 60. In the illustrated embodiment, the traces 76 also extend to contact pads 77 on the arms 72 on the plate 60. In the illustrated embodiment, the contact pads 77 are on platforms extending out of the major planar surface of the plate 60. The contact pads are at other locations (e.g., on the plate 60) in other embodiments (not shown). A layer of dielectric 78 is located between the conductive traces 76 and the base layer 68 to electrically insulate the traces from the base layer. Mount regions 74 include first and second mounting pads 80 and 82. Each mounting pad 82 includes an island or pad portion 84 in the base layer 68 that is electrically isolated from other portions of the base layer. Each trace 76 extends from the mounting pad 82, over (and electrically insulated from) the mounting pad 80. In the illustrated embodiment, the portions of traces 76 extending between the mounting pads 80 and 82 are enlarged over the portions of the traces on the flexure arms 62 to provide support for the island pad portions 84 in the base layer 68. The traces 76 extend to island pad portions 84, and in embodiments are electrically connected to the island pad portions by electrical connections such as a plated or other via 86 that extends through the dielectric 78 at the mounting pad 82. Other embodiments include other electrical connections in place of or in addition to vias 86, such as conductive adhesive that extends between the trace 76 and island pad portion 84 over the edges of the dielectric 78. Mounting pad 80 includes a pad portion 90 in the base layer 68 that is electrically isolated from the trace 76 by the dielectric 78. In the illustrated embodiments, the portions of the traces 76 over the mounting pads 80 and 82 are circular and open in the center, but take other forms in other embodiments (not shown).

Figure 7:
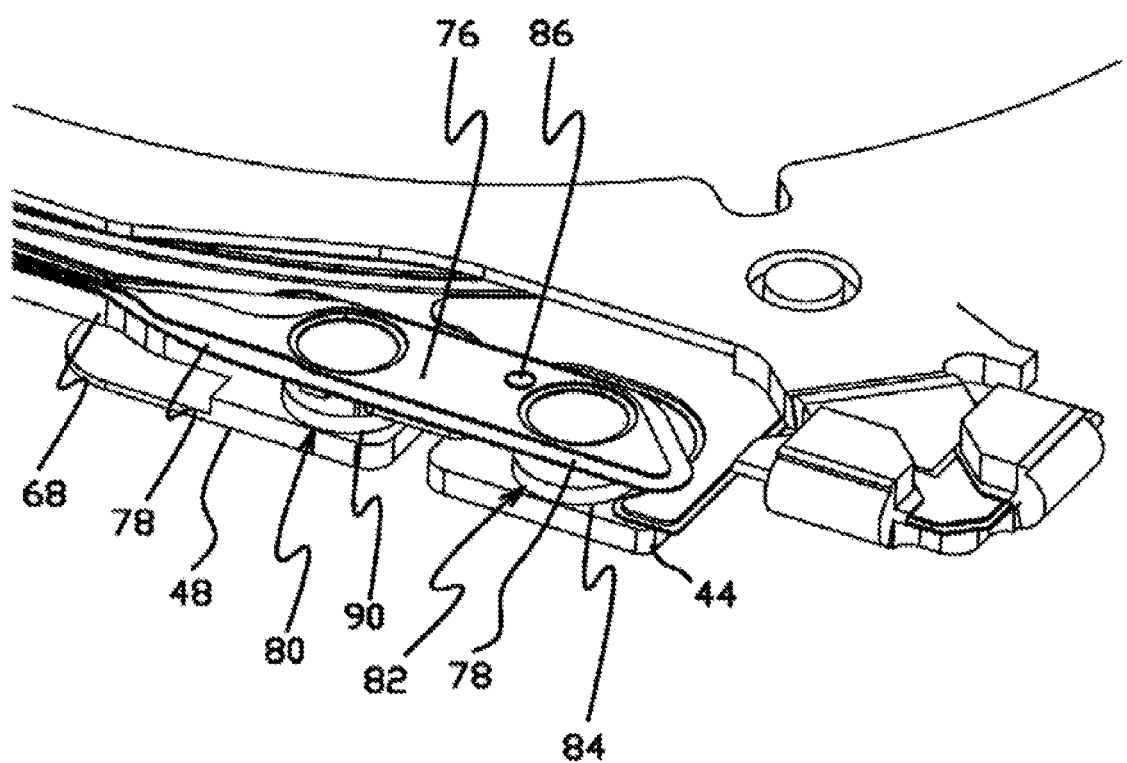
FIG. 7 is a detailed top isometric view of a support member mount region and a flexure arm mount region of the suspension shown in FIG. 1A.

As perhaps best shown in FIGS. 1A and 7, the mount regions 74 of the moving member flexure arms 62 are mechanically attached to the mount regions 33 and 35 of the support member 12. The traces 76 on the flexure arms 62 are electrically connected to the associated traces 18 on the support member 12. In embodiments, the mechanical connections are made by welds between the pad portions 84 and 90 in the base layer 68 of the moving member 14 and the corresponding pad portions 44 and 48 in the base layer 16 of the support member 12. The welds can, for example, be made through the openings in the traces 76 at the pad portions 84 and 90. The welds also enable electrical connections between the pad portions 84 and 90 of the moving member 14 and the corresponding pad portions 44 and 48 of the support member 12. By these electrical connections, the metal base layer 68 of the moving member 14, and thereby the moving crimps 70, are electrically connected in common to an associated trace 18 (i.e., such as 18b through via 50). Similarly, each flexure arm trace 76 is electrically connected to an associated trace 18 (i.e., such as 18a through via 46). Other embodiments of the invention (not shown) have other structures for mechanically mounting the flexure arms 62 to the support member 12, and/or for electrically connecting the traces 76 on the flexure arms to the associated traces 18 on the support member. In the illustrated embodiment, conductive metal regions 94 are located directly on the metal base layer 68 of the moving member 14 at the crimps 70 (i.e., there is no dielectric or other insulating material between the conductive metal regions and the metal base layer) to enhance the electrical connections between the metal base layer and the SMA wires 15 engaged by the crimps.

As described in greater detail below, the support member 12 and moving member 14 can be formed from additive and/or subtractive processes. Base layers 16 and/or 68 are stainless steel in embodiments. In other embodiments the base layers 16 and/or 68 are other metals or materials such as phosphor-bronze. Traces 18 and 76, terminals 30 and contact pads 32 can be formed from copper, copper alloys or other conductors. Polyimide or other insulating materials can be used as the dielectric 20 and 78. Other embodiments of the support member 12 and/or moving member 14 (not shown) have more or fewer traces 18 and 76, and the traces can be arranged in different layouts. Structures other than crimps 24, such as welds, can be used to attach the SMA wires 15 to the base layer 16. Other embodiments of the invention (not shown) have more or fewer crimps 24 and 70, and the crimps can be at different locations on the support member 12 and moving member 14, respectively.

Figure 2A:
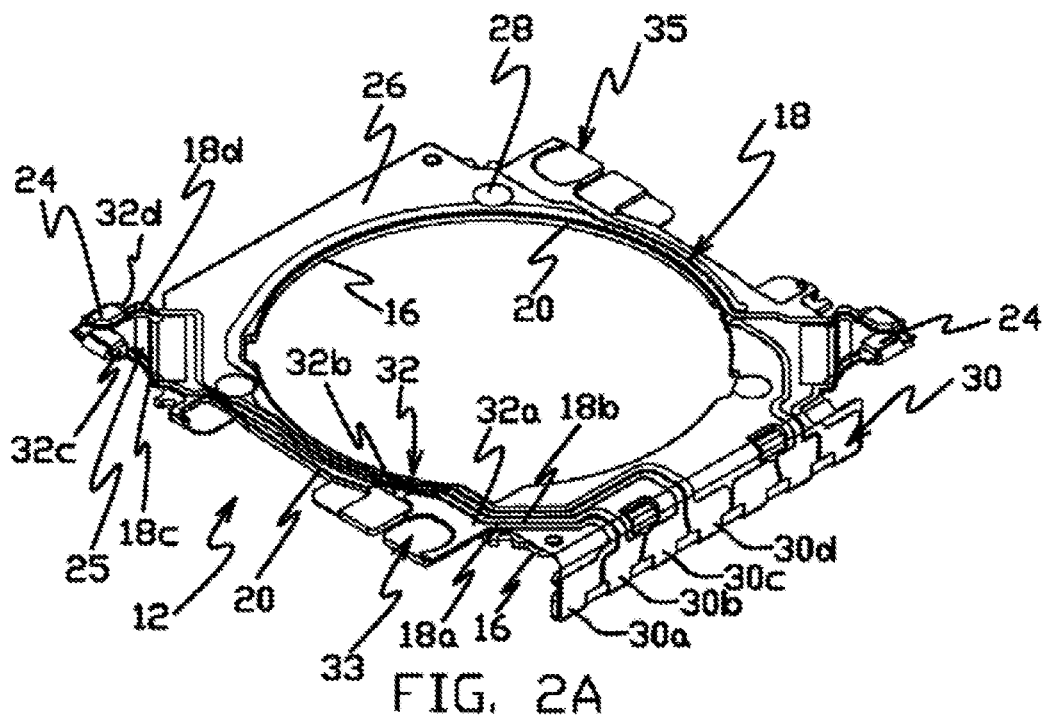
FIG. 2A is a top isometric view of the support member of the suspension shown in FIG. 1A.
Figure 2B:
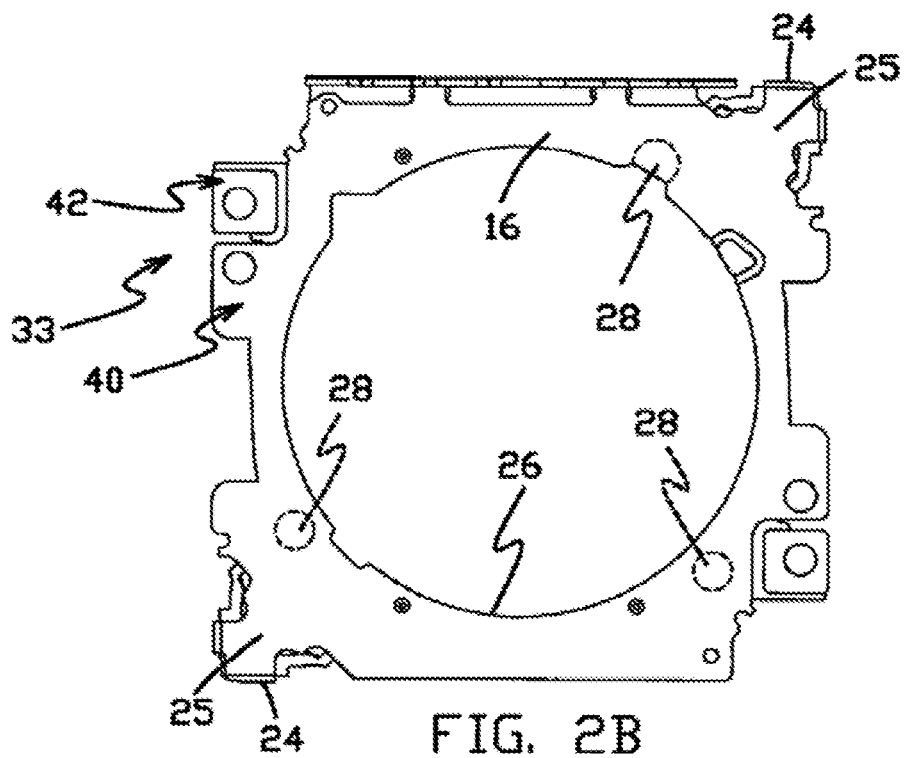
FIG. 2B is a bottom plan view of the support member shown in FIG. 2A.
Figure 8:
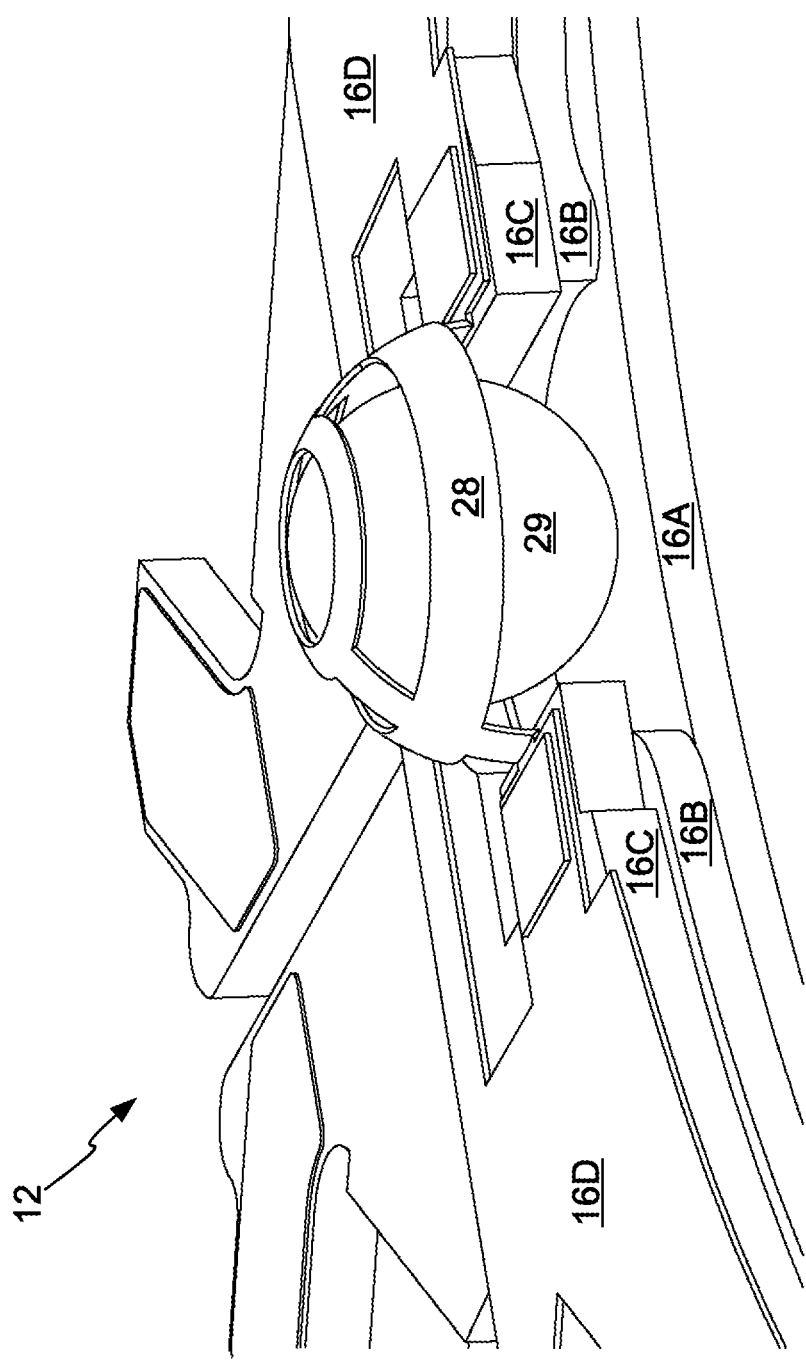
FIG. 8 is a detailed isometric view of a portion of the suspension shown in FIG. 1A, showing a bearing-retaining recess with a ball-bearing in the recess.

The embodiment of support member 12 illustrated in FIGS. 2A and 2B has three bearing receiving recesses 28. Other embodiments have fewer or more bearing recesses. FIG. 8 is an illustration of a portion of suspension assembly 10 illustrating a bearing 29, in the form of a ball, in one of the recesses 28. A bearing such as 29 is similarly located in the other recesses 28. As show, the bearing movably engages both the base layer 16 of the support member 12 and the base layer 68 at the plate 60 of the moving member 14 to enable movement of the moving member with respect to the support member. Other embodiments have other bearing structures and configurations (e.g., including formed dimples extending from the base layer 68 of the plate 60).

FIG. 8 is a detailed isometric view of a portion of support member 12, showing a bearing-retaining recess 28 with a ball-bearing 29 in the bearing-retaining recess 28. Bearing-retaining recess 28 loosely retains the ball-bearing 29 to allow the ball-bearing 29 to rotate during movement of the moving member 14 with respect to the support member 12. For example, an inner diameter of bearing-retaining recess 28 may be about 50 micrometers larger than an outer diameter of ball-bearing 29 to reduce contact areas between bearing-retaining recess 28 and ball-bearing 29. In the embodiment of FIG. 8, bearing-retaining recess 28 forms a portion of a sphere, such as a hemisphere or a portion of a hemisphere, although other shapes may be used to retain ball-bearing 29. As shown in FIG. 8 a tip of ball-bearing 29 extends through a central aperture of bearing-retaining recess 28 to allow ball-bearing 29 to contact moving member 14. The central aperture of bearing-retaining recess 28 is smaller than the diameter of ball-bearing 29 such that ball-bearing 29 cannot pass through the central aperture without deformation of the one or more layers.

Base layer 16 of support member 12 includes bearing plate 16A, insulator 16B, FPC base layer 16C and FPC conductor layer 16D. In the embodiment of FIG. 8, bearing-retaining recess 28 is formed in FPC conductor layer 16D of base layer 16. Bearing-retaining recesses may include shapes and other features etched in either one or both of FPC base layer 16C and FPC conductor layer 16D in various embodiments. In further examples, bearing-retaining recess 28 may be an etched element within one or more layers of at least one of support member 12 and moving member 14, including a base layer or spring layer. For example, the techniques described herein with respect to forming a bearing-retaining recess within support member 12 may be readily adapted to form a bearing-retaining recess within moving member 14.

Figure 9A:
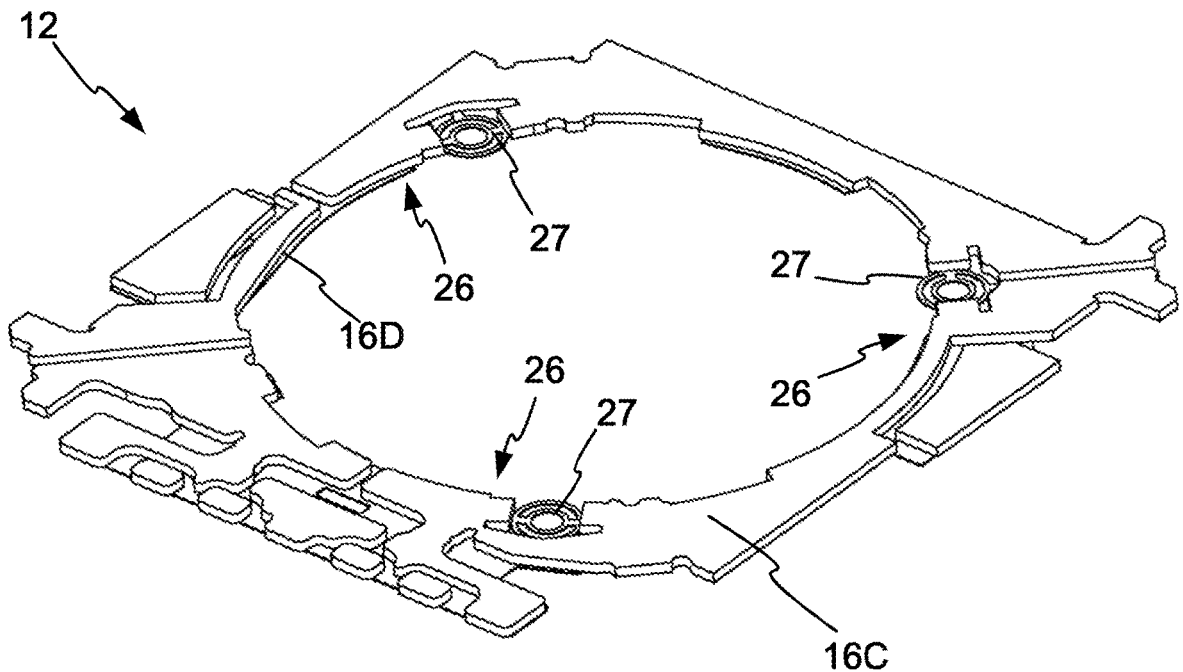
FIGS. 9A-9F are isometric views of a portion of the suspension during example assembly steps for the suspension.
Figure 9B:
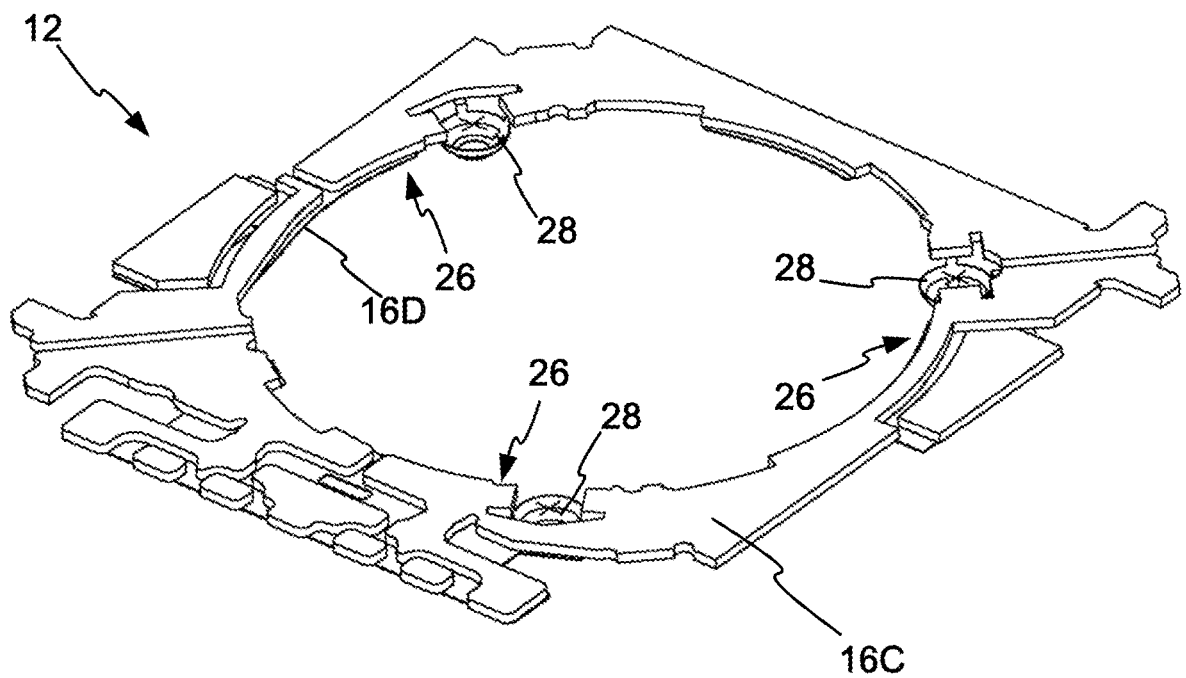
Figure 9C:
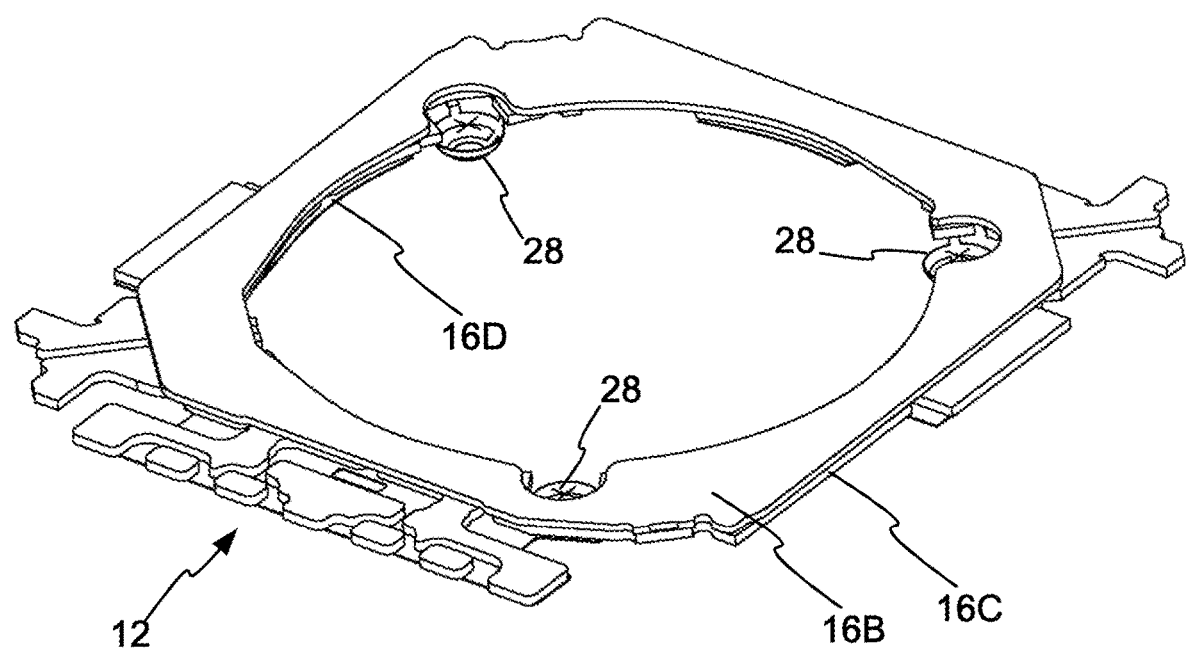
Figure 9D:
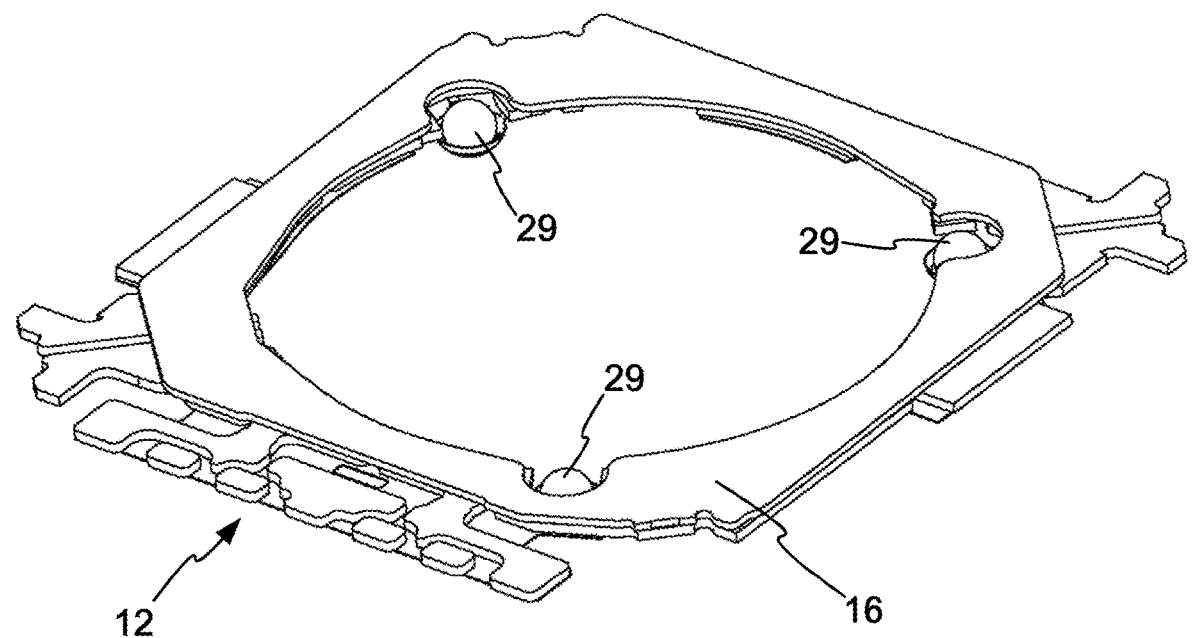
Figure 9E:
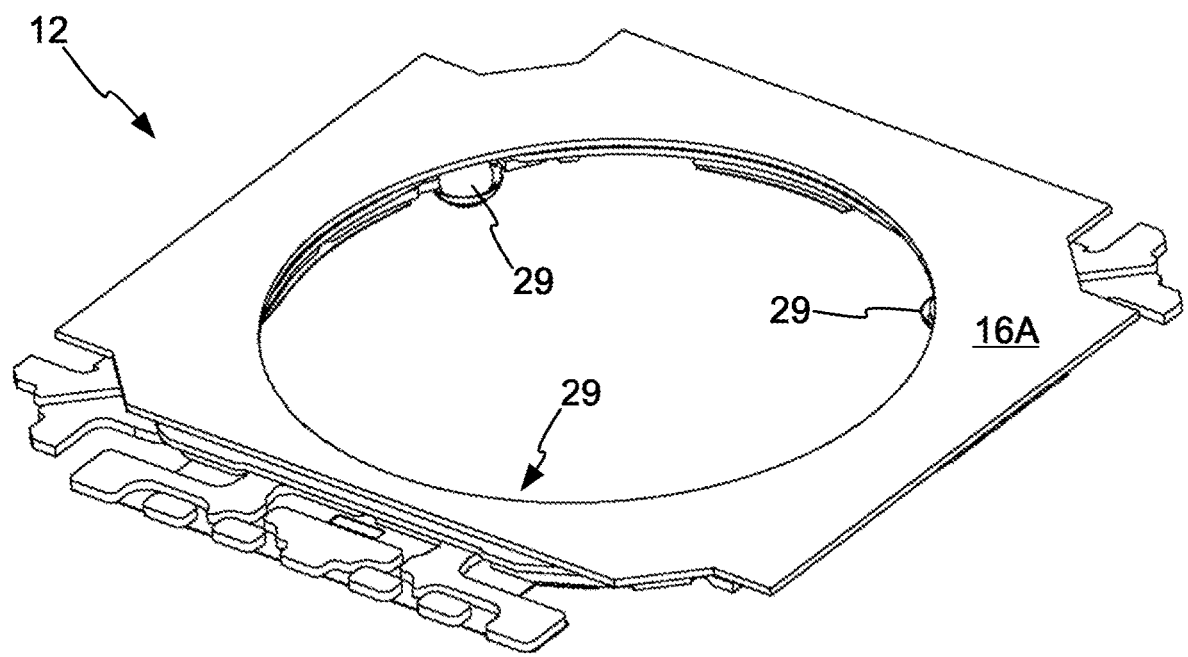
Figure 9F:
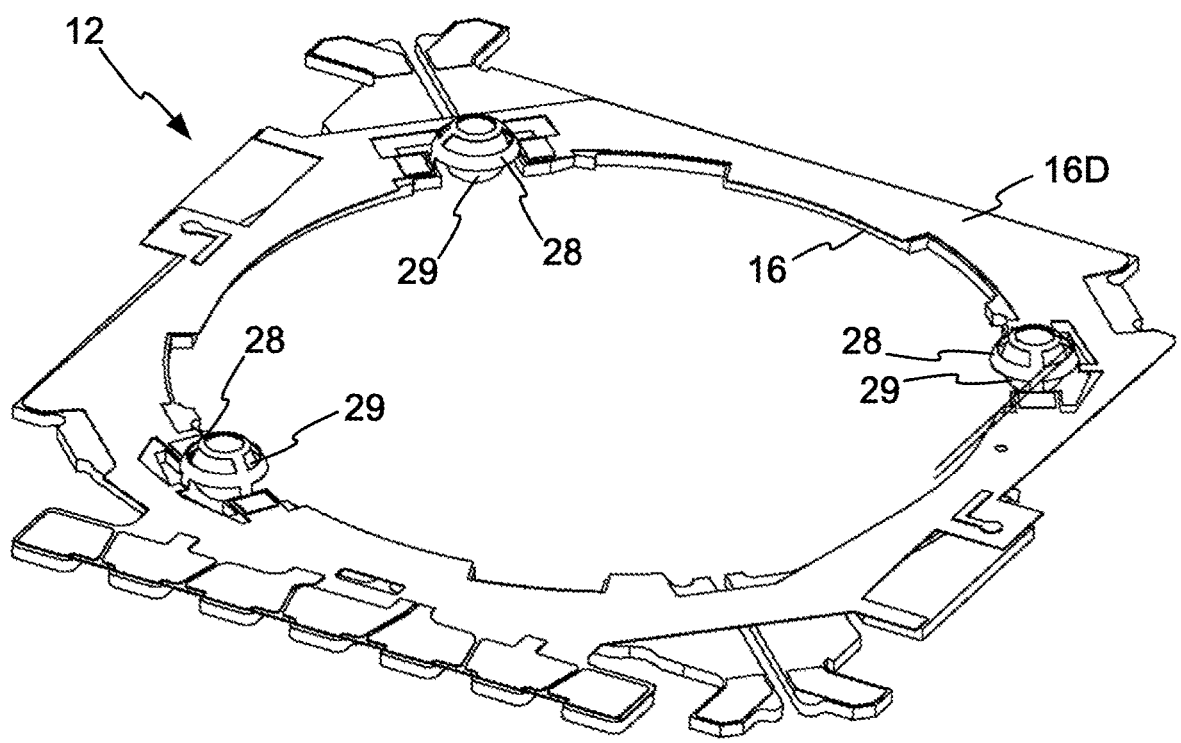

FIGS. 9A-9F are isometric views of a portion of the support member 12 during example assembly steps for the suspension. As shown in FIG. 9A, the FPC, including FPC base layer 16C and FPC conductor layer 16D is formed with substantially flat bearing-retaining features 27. In some particular examples, the FPC may include four layers, the details of which are not depicted in the drawings: a phosphor bronze layer (FPC base layer 16C), a dielectric layer, a copper layer (conductor layer 16D) and a cover coat. As shown in FIG. 9B, bearing-retaining features 27 are shaped to form the three bearing-retaining recesses 28, e.g., by plastic deformation through stamping, heating or other manipulation. As shown in FIG. 9C, insulator 16B is applied to the FPC. As shown in FIG. 9D, ball bearings 29 are pick and placed in the bearing-retaining recesses 28. As shown in FIG. 9E, bearing plate 16A is added to full constrain ball bearings 29 within bearing-retaining recesses 28. FIG. 9F illustrates the opposite side of support member 12 as compared to FIG. 9E.

Figure 4A:
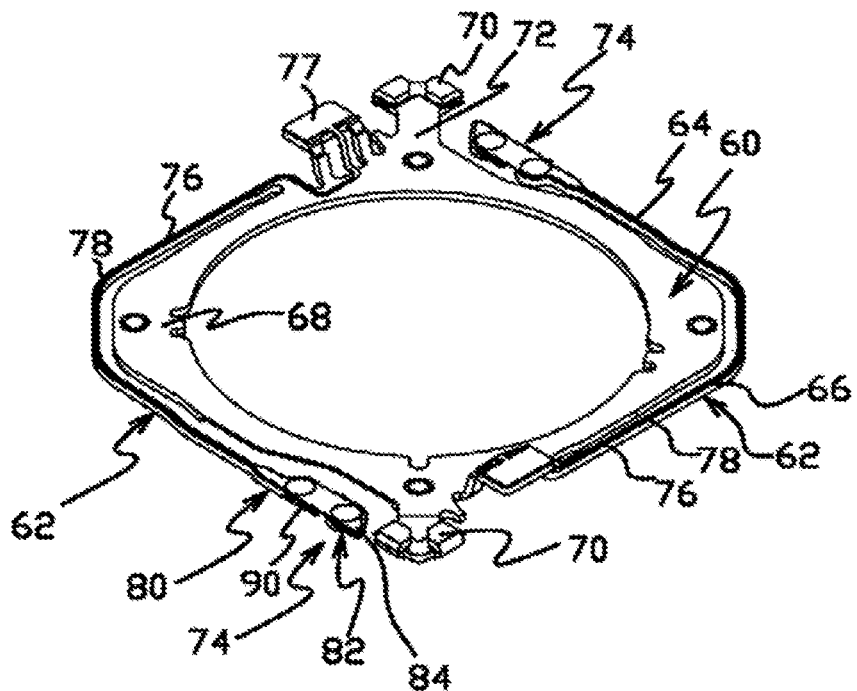
FIG. 4A is a top isometric view of the moving member of the suspension shown in FIG. 1A.
Figure 4B:
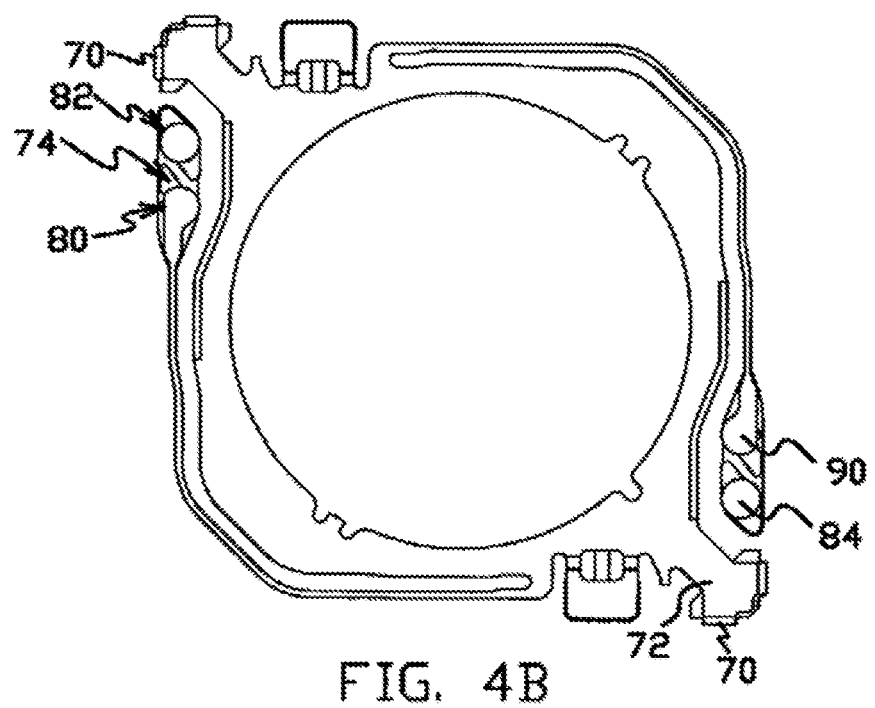
FIG. 4B is a bottom plan view of the moving member shown in FIG. 4A.
Figure 5:
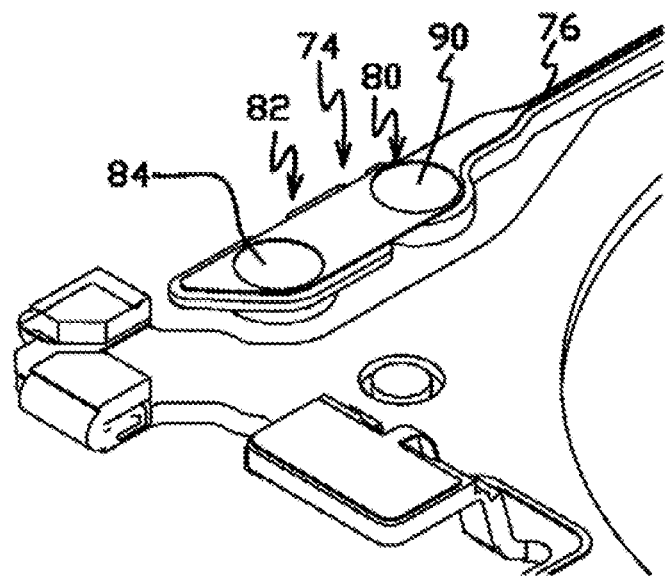
FIG. 5 is a detailed top isometric view of a flexure arm mount region and a wire attach of the moving member shown in FIG. 4A.
Figure 6:
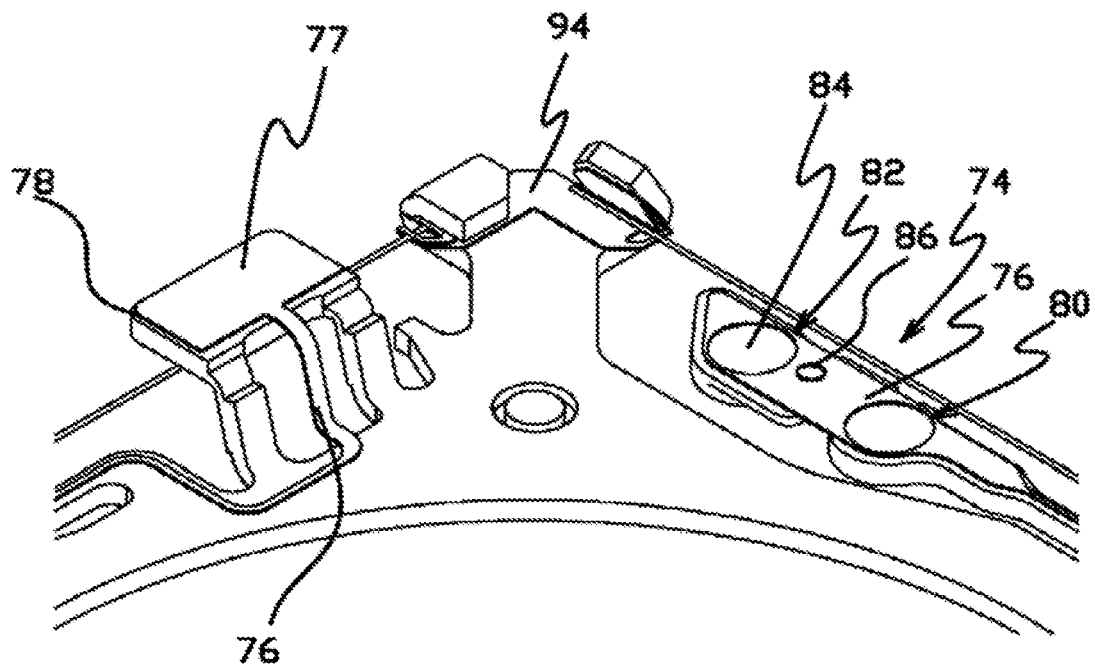
FIG. 6 is a detailed top isometric view of a flexure arm mounting region and a wire attach of the moving member shown in FIG. 4A.
Figure 10A:
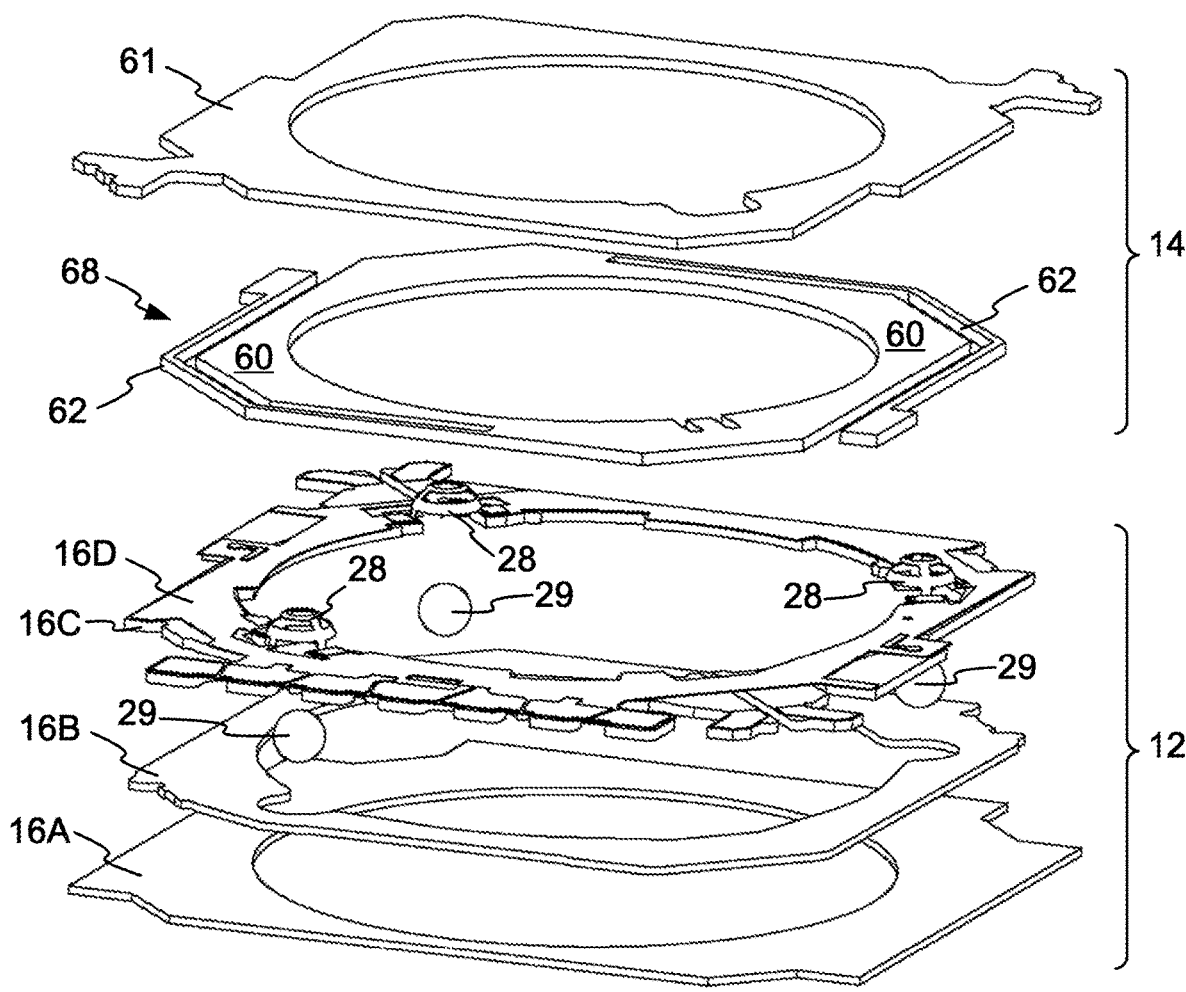
FIGS. 10A and 10B are isometric views of a portion of the suspension including bearing-retaining recesses with ball-bearing in the recesses in accordance with embodiments of the invention.
Figure 10B:
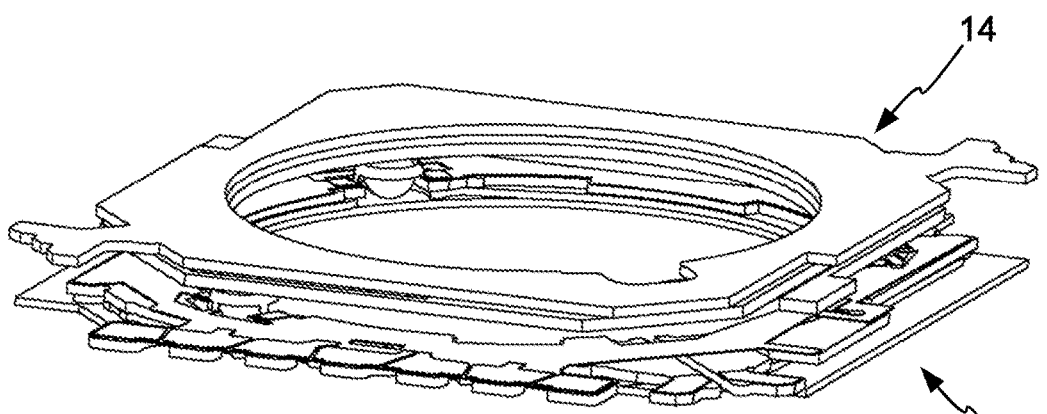

FIGS. 10A and 10B are isometric views of a portion of the suspension including support member 12 with bearing-retaining recesses 28 with ball-bearings 29 in the recesses 28 in accordance with embodiments of the invention. In particular, FIGS. 10A and 10B illustrate support member 12 in a stacked arrangement with moving member 14. Moving member 14 includes plate 60 and flexure arms 62 are formed in the same piece of material of spring metal base layer 68. As illustrated in FIGS. 10A and 10B, moving member 14 further includes moving crimp member 61 as a separate element than base layer 68. However, as previously described, moving crimps 70 may instead be formed in the same piece of material of spring metal base layer 68 as plate 60 and flexure arms 62, e.g., as illustrated in FIGS. 4A and 4B.

As shown in FIGS. 10A and 10B, bearing-retaining recesses 28 are between the bearing plate portion 16A of the support member 12 and the moving plate portion 60 of the moving member 14. With ball-bearings 29 positioned in bearing-retaining recesses 28, ball-bearings 29 are between and engaging bearing plate portion 16A of the support member 12 and moving plate portion 60 of the moving member 14, to enable movement of the moving member 14 with respect to the support member 12. For example, including three or more bearing-retaining recesses 28 with three or more ball-bearings 29 within the suspension assembly prevents direct contact between support member 12 and the moving member 14.

Figure 11:
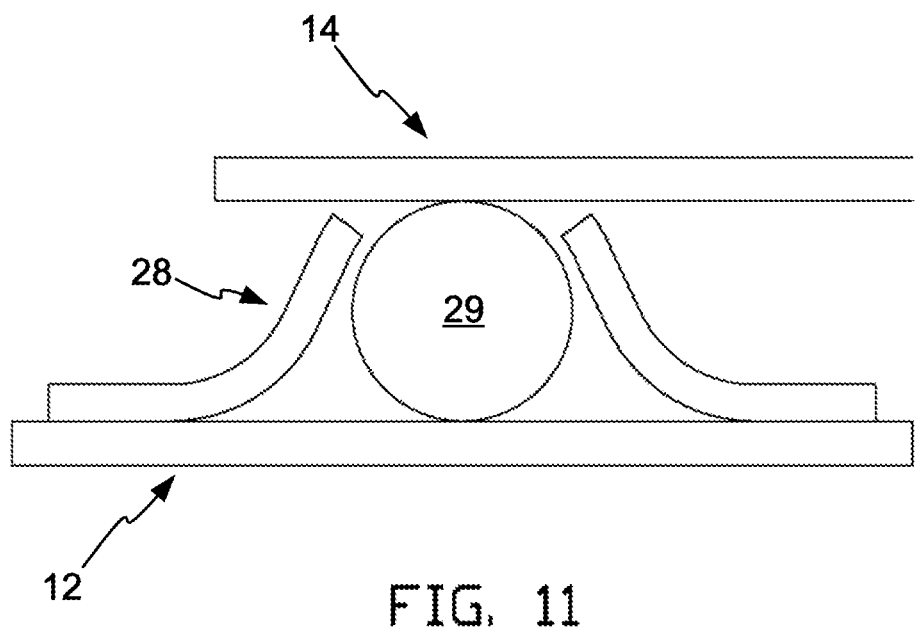
FIGS. 11 and 12 are conceptual illustrations representing embodiments with the bearing-retaining recess in the support member or, alternatively, in the moving member of the suspension.
Figure 12:
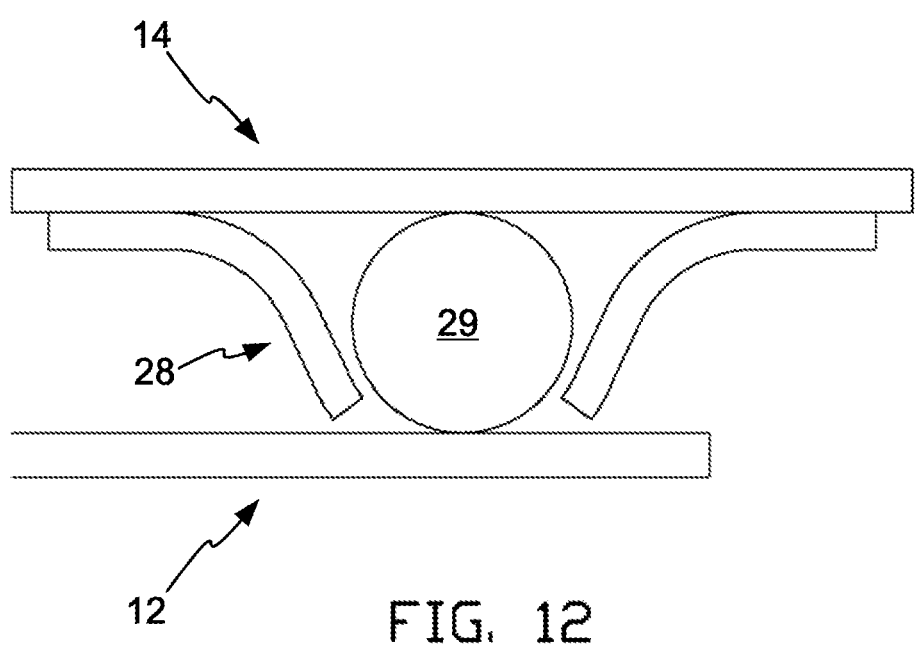

FIG. 11 is a conceptual illustration representing embodiments with the bearing-retaining recess 28 formed from layers of the support member 12. Alternatively, FIG. 12 is a conceptual illustration representing embodiments with the bearing-retaining recess 28 formed from layers of the moving member 14. The techniques described herein with respect to forming a bearing-retaining recess within support member 12 may be readily adapted to form a bearing-retaining recess within moving member 14.

FIGS. 13-14D are conceptual illustrations representing embodiments in which a bearing-retaining recess 128 includes an aperture 117 smaller than the diameter of the ball-bearing 29 within one or more layers of one of the support member and the moving member such that ball-bearing 29 cannot pass through aperture 117 without deformation of the one or more layers. In the example of FIGS. 13-14D, the bearing-retaining recess 128 is within a support member, and bearing plate 116A, insulator 116B, FPC base layer 116C and FPC conductor layer 116D of the support member are shown in FIG. 13. In other examples, bearing-retaining recess 128 instead may be within layers of a moving member, as described within respect to bearing-retaining recesses 28. Bearing plate 116A, insulator 116B, FPC base layer 116C and FPC conductor layer 116D are substantially similar to bearing plate 16A, insulator 16B, FPC base layer 16C and FPC conductor layer 16D as described previously with the exception of that bearing-retaining recess 128 is in place of bearing-retaining recesses 28.

FIGS. 14A-14D illustrate steps for placing ball-bearing 29 within bearing-retaining recess 128. As shown in FIG. 14A, ball-bearing 29 is positioned above aperture 117 of bearing-retaining recess 128. Then, as shown in FIG. 14B, ball-bearing 29 is forcibly pushed through aperture 117. Because aperture 117 is smaller than ball-bearing 29, the edges of aperture 117 elastically deform by deflecting as ball-bearing 29 is forcibly pushed through aperture 117. As shown in FIG. 14C, ball-bearing 29 is pushed into bearing-retaining recess 128, and bearing plate 116A is temporarily deflected which allows the lip of aperture 117 to spring in place above ball-bearing 29. As shown in FIG. 14D, once the push force on ball-bearing 29 is removed, bearing 29 extends out of aperture 117 to facilitate contact with a moving member (not shown).

In alternative embodiments (not shown), aperture 117 may instead be located on the bearing plate side of the support member or the moving member. In such embodiments, the bearing plate may be added on top of aperture 117 after ball-bearing 29 is placed within the bearing-retaining recess 128. In such examples, the bearing-retaining recess 128 would include an additional aperture facing the opposing bearing plate to facilitate contact with the opposing bearing plate.

FIGS. 15A-15F are conceptual illustrations representing example aperture shapes for embodiments in which a bearing-retaining recess includes an aperture within one or more layers of one of the support member and the moving member.

Figure 15A:
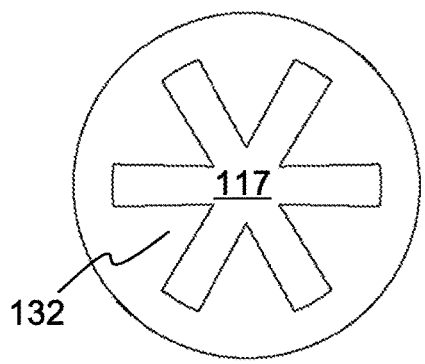
FIGS. 15A-15F are conceptual illustrations representing example aperture shapes for embodiments in which a bearing-retaining recess includes an aperture within one or more layers of one of the support member and the moving member.
Figure 15B:
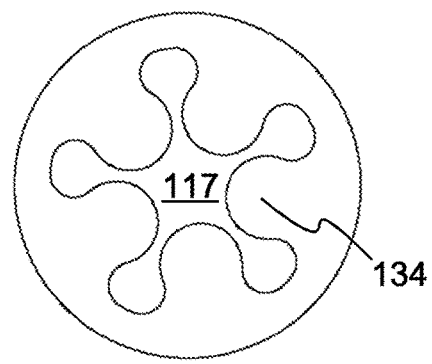
Figure 15C:
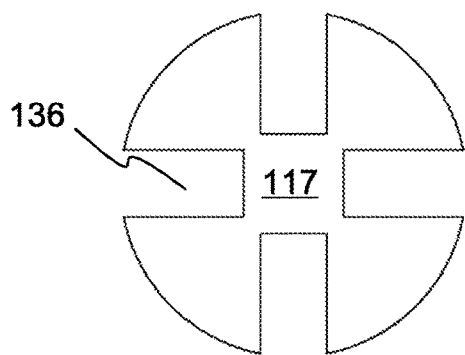

FIGS. 15A-15C illustrate example embodiments of aperture 117, as described with respect to FIGS. 13-14D. In the embodiment of FIG. 15A, flexible triangular petals 132 surround and combine to form the perimeter of aperture 117. In the embodiment of FIG. 15B, flexible oblong, rounded petals 134 surround and combine to form the perimeter of aperture 117. In the embodiment of FIG. 15C, flexible rectangular petals 136 surround and combine to form the perimeter of aperture 117. In each of the examples of FIGS. 15A-15C, the flexible petals may elastically deform to allow ball-bearing 29 to be, during the assembly of the suspension assembly, pushed though aperture 117 to its position between and engaging the bearing plate portion of the support member and the moving plate portion of the moving member, as described with respect to FIGS. 14A-14D. While the flexible petals are depicted as substantially flat, the flexible petals may alternatively be contoured, e.g., to form a slight recess to simplify the placement of ball-bearing 29 as shown in FIG. 14A.

Figure 15D:
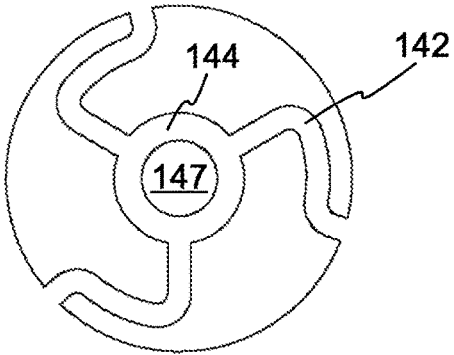
Figure 15E:
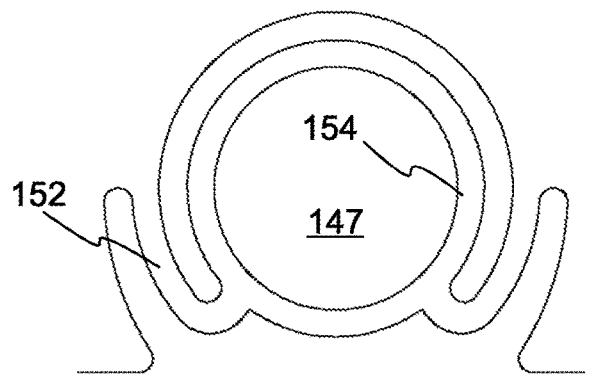
Figure 15F:
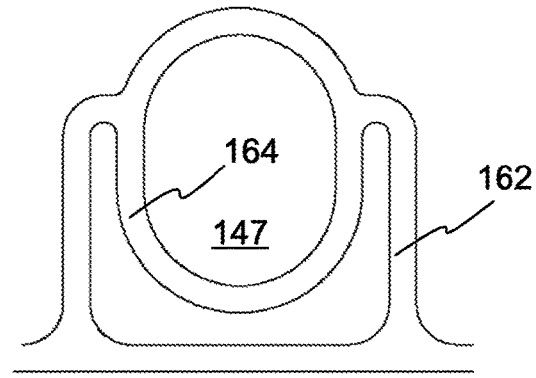

FIGS. 15D-15F illustrate example embodiments of bearing-retaining elements formed in a substantially flat layer of the support member or the moving member. For example, these embodiment may be utilized in place of substantially flat bearing-retaining features 27 (FIG. 9A).

In the embodiment of FIG. 15D, helical arms 142 connect to ring 144, which forms central aperture 147 for the bearing-retaining element. Helical arms 142 will cause ring 144 to rotate as it is displaced to form a bearing-retaining recess. In the embodiment of FIG. 15E, arms 152 connect to ring 154, which forms central aperture 147 for the bearing-retaining element. In the embodiment of FIG. 15F, arms 162 connect to oblong ring 164, which forms central aperture 147 for the bearing-retaining element. As compared to the other embodiments described herein, oblong ring 164 may provide varying degrees of freedom to a ball-bearing 29, e.g., the ball-bearing may move more freely in a first direction than in a perpendicular direction.

Bearing-retaining elements of FIGS. 15D-15F may be formed from substantially flat layers in either the support member or the moving member. In some examples, bearing-retaining elements of FIGS. 15D-15F may be plastically deformed to displace the ring from its planar layer within either the support member or the moving member to create a bearing-retaining recess, e.g., as described with respect to bearing-retaining features 27 and bearing-retaining recess 28. In the same or different examples, bearing-retaining elements of FIGS. 15D-15F may be elastically deformed, e.g., due to the force placement of a ball-bearing 29, to displace the ring from its planar layer within either the support member or the moving member to create a bearing-retaining recess. In the same or different examples, the arms of bearing-retaining elements of FIGS. 15D-15F may be plastically deformed through laser heat treatment, i.e., heat-adjustable holding arms, to displace the ring from its planar layer within either the support member or the moving member to create a bearing-retaining recess.

Figure 16A:
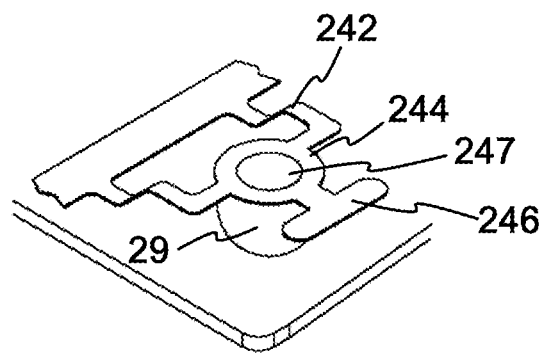
Figure 16B:
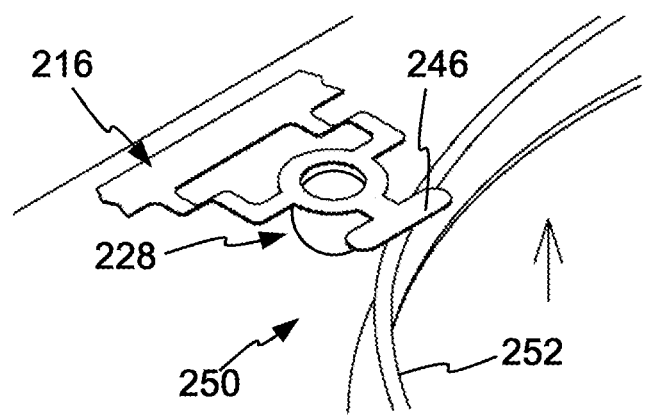

Bearing-retaining elements of FIGS. 15D-15F may also optionally be used in combination with the techniques of FIGS. 16A and 16B.

FIGS. 16A and 16B are conceptual illustrations representing embodiments in which base layer 216 forms a bearing-retaining recess 228. In the example of FIGS. 16A and 16B, the bearing-retaining recess 228 is within a support member. In other examples, bearing-retaining recess 228 instead may be within layers of a moving member, as described within respect to bearing-retaining recesses 28. Base layer 216 is substantially similar to base layer 16 as described previously with the exception of that bearing-retaining recess 228 is in place of bearing-retaining recesses 28.

To form bearing-retaining recess 228, arms 242 connect to ring 244, which forms central aperture 247 bearing-retaining recess 228. However, as shown in FIG. 16A, ball-bearing 29 is compressibly pinched between the bearing plate of base layer 216 and ring 244 as arms 242 are configured to provide less space between base layer 216 and ring 244 than required to allow ball-bearing 29 to rotate freely. This may simplify manufacture of the assembly by securing ball-bearing 29 during the assembly. Then, as shown in FIG. 16B, boss 252, which may be a bearing race or other protrusion, extending from housing element 250, functions to lift against tab 246 to lift ring 244 off ball-bearing 29 and enlarge bearing-retaining recess 228 to allow ball-bearing 29 to rotate during movement of the moving member with respect to the support member. Thus, ball-bearing 29 may be fixedly secured within bearing-retaining recess 228 during manufacture of the assembly and released during a later assembly step including housing 250.

Figure 17:
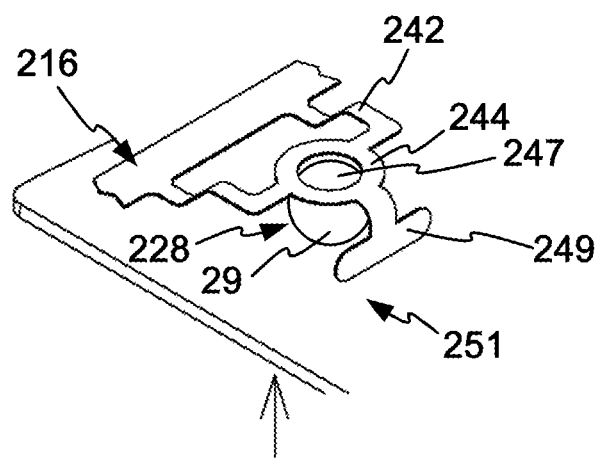

FIG. 17 illustrates an alternative to FIGS. 16A and 16B in which FIG. 17 the flexible retainer includes a bent tab 249 configured to engage a plate 251 in the full-assembled suspension assembly to allow the ball-bearing 29 to rotate during movement of the moving member with respect to the support member. As shown in FIG. 17, bent tab 249 replaces tab 246 of FIGS. 16A and 16B. In this example, bent tab 249 forms a bend to contact a major surface of housing element 251 rather than contacting a boss of the housing element as with tab 246. Again, ball-bearing 29 may be fixedly secured within bearing-retaining recess 228 during manufacture of the assembly and released during a later assembly step, e.g., during the installation of support member within a housing component. During assembly, housing element 251, functions to lift against tab 249 to lift ring 244 off ball-bearing 29 and enlarge bearing-retaining recess 228 to allow ball-bearing 29 to rotate during movement of the moving member with respect to the support member. Thus, ball-bearing 29 may be fixedly secured within bearing-retaining recess 228 during manufacture of the assembly and released during a later assembly step including housing 251.

FIGS. 18A-18C illustrate an alternative embodiment in which base layer 316 forms a bearing-retaining recess 328. Bearing-retaining recess 328 includes an aperture 347 smaller than the diameter of the ball-bearing 29 within one or more layers of one of the support member and the moving member. In the example of FIGS. 18A-18C, the bearing-retaining recess 328 is within a support member. In other examples, bearing-retaining recess 328 instead may be within layers of a moving member, as described within respect to bearing-retaining recesses 28. Base layer 316 is substantially similar to base layer 16 as described previously with the exception of that bearing-retaining recess 328 is in place of bearing-retaining recesses 28.

Base layer 316 forms two plastically deformable tabs 345, 346. As shown in FIG. 18B, tab 345 is configure to elastically bend as ball-bearing 29 is forcibly pushed through aperture 347. In this manner, this embodiment is similar to that described with respect to FIGS. 13-14D, however, tab 345 remains in contact with ball-bearing 29 after ball-bearing 29 is pushed into bearing-retaining recess 328. Ball-bearing 29 is compressibly pinched between the bearing plate of base layer 316 and tab 345. This may simplify manufacture of the assembly by securing ball-bearing 29 during the assembly. Then, as shown in FIG. 18C, boss 352, which may be a bearing race or other protrusion, extending from housing element 350, functions to lift against tab 346 to rotate tab 345 off ball-bearing 29 and enlarge bearing-retaining recess 328 to allow ball-bearing 29 to rotate during movement of the moving member with respect to the support member. Thus, ball-bearing 29 may be fixedly secured within bearing-retaining recess 328 during manufacture of the assembly and released during a later assembly step including housing 350.

In some examples, bearing-retaining elements of FIGS. 16A-18C may be plastically deformed to displace the ring from its planar layer within either the support member or the moving member to create a bearing-retaining recess, e.g., as described with respect to bearing-retaining features 27 and bearing-retaining recess 28. In the same or different examples, bearing-retaining elements of FIGS. 16A-18 may be elastically deformed, e.g., due to the force placement of a ball-bearing 29, to displace the ring from its planar layer within either the support member or the moving member to create a bearing-retaining recess. In the same or different examples, the arms of bearing-retaining elements of FIGS. 16A-18 may be plastically deformed through laser heat treatment, i.e., heat-adjustable holding arms, to displace the ring from its planar layer within either the support member or the moving member to create a bearing-retaining recess.

Suspensions in accordance with embodiments of the invention offer important advantages. They can for example, be efficiently fabricated and assembled. They have relatively low profiles or heights.

Although the invention has been described with reference to preferred embodiments, those of skill in the art will recognize that changes can be made in form and detail without departing from the spirit and scope of the invention.

What is claimed is:

1. A suspension assembly, comprising:
   a support member including a support metal base layer formed as a first single unitary metal component, the support member including a bearing plate portion formed in the support metal base layer; and
   a moving member including a moving metal base layer formed as a second single unitary metal component and mounted to the support member, including:
   a moving plate portion in the moving metal base layer; and
   flexure arms in the moving metal base layer extending from the moving plate portion and coupled to the support member;
   a bearing-retaining recess between the bearing plate portion of the support member and the moving plate portion of the moving member; and
   a ball-bearing within the bearing-retaining recess, and between and engaging the bearing plate portion of the support member and the moving plate portion of the moving member, to enable movement of the moving member with respect to the support member.

2. The suspension assembly of claim 1 wherein the bearing-retaining recess is in the moving member.

3. The suspension assembly of claim 1 wherein the bearing-retaining recess is in the support member.

4. The suspension assembly of claim 1 wherein the bearing-retaining recess loosely retains the ball-bearing to allow the ball-bearing to rotate during movement of the moving member with respect to the support member.

5. The suspension assembly of claim 1 wherein:
   the suspension assembly includes a plurality of bearing-retaining recesses; and
   the suspension assembly includes a ball-bearing in each of the plurality of bearing-retaining recesses.

6. The suspension assembly of claim 1 wherein the bearing-retaining recess is an etched element within one or more layers of at least one of the support member and the moving member.

7. The suspension assembly of claim 1 wherein the bearing-retaining recess forms a portion of a sphere.

8. The suspension assembly of claim 1 wherein:
   the bearing-retaining recess includes an aperture within one or more layers of one of the support member and the moving member; and
   the aperture is smaller than a diameter of the ball-bearing such that the ball-bearing cannot pass through the aperture without deformation of the one or more layers.

9. The suspension assembly of claim 8 wherein the bearing-retaining recess includes flexible petals that allow the ball-bearing to be, during an assembly process of the suspension assembly, pushed though the aperture to its position between and engaging the bearing plate portion of the support member and the moving plate portion of the moving member.

10. The suspension assembly of claim 8 wherein:
    the bearing-retaining recess includes a plastically deformable tab that allow the ball-bearing to be, during an assembly process of the suspension assembly, pushed though through the aperture to its position between and engaging the bearing plate portion of the support member and the moving plate portion of the moving member; and
    wherein the suspension assembly includes a boss that, in the full-assembled suspension assembly, pushes the plastically deformable tab to enlarge the bearing-retaining recess to allow the ball-bearing to rotate during movement of the moving member with respect to the support member.

11. The suspension assembly of claim 1 wherein:
the bearing-retaining recess includes a flexible retainer formed within one or more layers of one of the support member and the moving member;
the flexible retainer contacts the ball-bearing during an assembly process of the suspension assembly to hold the ball-bearing its position between the bearing plate portion of the support member and the moving plate portion of the moving member.

12. The suspension assembly of claim 11 wherein the suspension assembly includes a boss that, in the full-assembled suspension assembly, pushes the flexible retainer to enlarge the bearing-retaining recess to allow the ball-bearing to rotate during movement of the moving member with respect to the support member.

13. The suspension assembly of claim 12 wherein the suspension assembly includes a plate forming the boss and a bearing race.

14. The suspension assembly of claim 12 wherein the one or more layers of one of the support member and the moving member are substantially flat.

15. The suspension assembly of claim 11 wherein the flexible retainer includes a bent tab configured to engage a plate in the full-assembled suspension assembly to allow the ball-bearing to rotate during movement of the moving member with respect to the support member.

16. The suspension assembly of claim 11 wherein the flexible retainer includes heat-adjustable holding arms.

17. The suspension assembly of claim 1 wherein:
the support member includes a static wire attach structure in the support metal base layer;
the moving member includes a moving wire attach structure in the moving metal base layer; and
the suspension assembly includes a shape memory alloy wire attached to and extending between the static wire attach structure of the support member and the moving wire attach structure of the moving member.

18. A camera lens suspension assembly, comprising:
a support member including a support metal base layer formed as a first single unitary metal component, the support member including a bearing plate portion in the support metal base layer; and
a moving member including a moving metal base layer formed as a second single unitary metal component and mounted to the support member, including:
a moving plate portion in the moving metal base layer; and
flexure arms in the moving metal base layer extending from the moving plate portion and coupled to the support member;
a plurality of bearing-retaining recess between the bearing plate portion of the support member and the moving plate portion of the moving member; and
a plurality of ball-bearings within the bearing-retaining recesses, and between and engaging the bearing plate portion of the support member and the moving plate portion of the moving member; to enable movement of the moving member with respect to the support member.

19. The suspension assembly of claim 18 wherein the bearing-retaining recesses are in the moving member.

20. The suspension assembly of claim 18 wherein the bearing-retaining recesses are in the support member.

21. The suspension assembly of claim 18 wherein the bearing-retaining recesses loosely retains the ball-bearings to allow the ball-bearing to rotate during movement of the moving member with respect to the support member.

22. The suspension assembly of claim 18 wherein the bearing-retaining recesses include etched elements within one or more layers of at least one of the support member and the moving member.

23. The suspension assembly of claim 18 wherein the bearing-retaining recess forms a portion of a sphere.

24. The suspension assembly of claim 18 wherein:
the bearing-retaining recess includes an aperture within one or more layers of one of the support member and the moving member; and
the aperture is smaller than a diameter of the ball-bearing such that the ball-bearing cannot pass through the aperture without deformation of the one or more layers.

25. The suspension assembly of claim 24 wherein the bearing-retaining recess includes flexible petals that allow the ball-bearing to be, during an assembly process of the suspension assembly, pushed through the aperture to its position between and engaging the bearing plate portion of the support member and the moving plate portion of the moving member.

26. The suspension assembly of claim 18 wherein:
the bearing-retaining recess includes a flexible retainer formed within one or more layers of one of the support member and the moving member;
the flexible retainer contacts the ball-bearing during an assembly process of the suspension assembly to hold the ball-bearing its position between the bearing plate portion of the support member and the moving plate portion of the moving member.

27. A support member for a suspension assembly of the type configured to have a moving member mounted to the support member, comprising:
a support metal base layer formed as a single unitary metal component;
a bearing plate portion formed in the support metal base layer; and
a bearing-retaining recess in the support metal base layer configured to secure a ball-bearing within the bearing-retaining recess, between and engaging the bearing plate portion of the support member and a moving plate portion of the moving member, to enable movement of the moving member with respect to the support member.

28. A moving member for a suspension assembly of the type configured to have a support member mounted to the moving member, comprising:
a moving metal base layer formed as a single unitary metal component;
a moving plate portion in the moving metal base layer; and
a bearing-retaining recess in the moving metal base layer configured to secure a ball-bearing within the bearing-retaining recess, between and engaging a bearing plate portion of the support member and the moving plate portion of the moving member, to enable movement of the moving member with respect to the support member.

* * * * *